(12) United States Patent
Jeng et al.

(10) Patent No.: US 10,163,876 B2
(45) Date of Patent: Dec. 25, 2018

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Shin-Puu Jeng, Hsinchu (TW); Jui-Pin Hung, Hsinchu (TW); Feng-Cheng Hsu, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/987,329

(22) Filed: May 23, 2018

(65) Prior Publication Data
US 2018/0269189 A1 Sep. 20, 2018

Related U.S. Application Data

(63) Continuation of application No. 15/371,830, filed on Dec. 7, 2016, now Pat. No. 9,985,006.
(Continued)

(51) Int. Cl.
*H01L 25/10* (2006.01)
*H01L 21/48* (2006.01)
(Continued)

(52) U.S. Cl.
CPC .......... *H01L 25/105* (2013.01); *H01L 21/486* (2013.01); *H01L 21/4853* (2013.01); *H01L 21/4857* (2013.01); *H01L 21/565* (2013.01); *H01L 21/78* (2013.01); *H01L 22/14* (2013.01); *H01L 22/32* (2013.01); *H01L 23/3114* (2013.01); *H01L 23/5383* (2013.01); *H01L 23/5384* (2013.01); *H01L 23/5386* (2013.01); *H01L 23/5389* (2013.01); *H01L 25/0655* (2013.01); *H01L 25/50* (2013.01); *H01L 2224/16225* (2013.01);
(Continued)

(58) Field of Classification Search
CPC ............ H01L 21/4853; H01L 21/4857; H01L 21/486; H01L 21/565; H01L 21/78; H01L 25/105; H01L 25/50; H01L 22/32; H01L 23/3114; H01L 23/5383; H01L 23/5384; H01L 23/5386; H01L 23/5389; H01L 2225/1035; H01L 2225/1058
See application file for complete search history.

(56) References Cited

U.S. PATENT DOCUMENTS

| | | | |
|---|---|---|---|
| 2013/0062761 A1* | 3/2013 | Lin | H01L 23/49816 257/738 |
| 2014/0252646 A1* | 9/2014 | Hung | H01L 23/481 257/774 |
| 2015/0382463 A1* | 12/2015 | Kim | H01L 23/49822 361/767 |

\* cited by examiner

*Primary Examiner* — Yosef Gebreyesus
(74) *Attorney, Agent, or Firm* — WPAT, P.C., Intellectual Property Attorneys; Anthony King

(57) ABSTRACT

A method of manufacturing a structure includes: providing a substrate; forming an adhesive layer over the substrate; forming an interconnect layer comprising a metal line and a metal via over the adhesive layer; forming a plurality of conductive pads over the interconnect layer; forming conductive pillars over the interconnect layer; disposing a first semiconductor die over the conductive pads, the first semiconductor die being spaced apart from the conductive pillars; bonding a second semiconductor die with the conductive pillars; and removing the substrate and the adhesive layer to expose a conductive portion of the interconnect layer.

20 Claims, 34 Drawing Sheets

Related U.S. Application Data

(60) Provisional application No. 62/343,402, filed on May 31, 2016.

(51) Int. Cl.
*H01L 21/56* (2006.01)
*H01L 21/78* (2006.01)
*H01L 21/66* (2006.01)
*H01L 23/31* (2006.01)
*H01L 23/538* (2006.01)
*H01L 25/00* (2006.01)
*H01L 25/065* (2006.01)

(52) U.S. Cl.
CPC ............... *H01L 2224/32145* (2013.01); *H01L 2224/48091* (2013.01); *H01L 2224/48227* (2013.01); *H01L 2224/73265* (2013.01); *H01L 2224/81005* (2013.01); *H01L 2224/97* (2013.01); *H01L 2225/1035* (2013.01); *H01L 2225/1058* (2013.01); *H01L 2924/15311* (2013.01); *H01L 2924/181* (2013.01); *H01L 2924/18161* (2013.01); *H01L 2924/19105* (2013.01); *H01L 2924/19106* (2013.01)

SEMICONDUCTOR STRUCTURE AND MANUFACTURING METHOD THEREOF

PRIORITY CLAIM AND CROSS-REFERENCE

This application is a continuation of U.S. patent application Ser. No. 15/371,830 filed Dec. 7, 2016, which claims the benefit of U.S. provisional application 62/343,402 filed May 31, 2016. All of the above-referenced applications are hereby incorporated herein by reference in their entirety.

BACKGROUND

Electronic equipment involving semiconductive devices are essential for many modern applications. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

As technologies evolve, designs for devices become more complicated in consideration of smaller dimensions and an increase of functionality and the amount of circuitries. Numerous manufacturing operations are implemented within such a small and high performance semiconductor device. The manufacturing of a semiconductor device becomes more complicated in a miniaturized scale, and the increase in complexity of manufacturing may cause deficiencies such as high yield loss, poor reliability of the electrical interconnection, low testing coverage, etc. Therefore, there is a continuous need to modify the structure and manufacturing method of the devices in the electronic equipment in order to improve device robustness as well as reduce manufacturing cost and processing time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
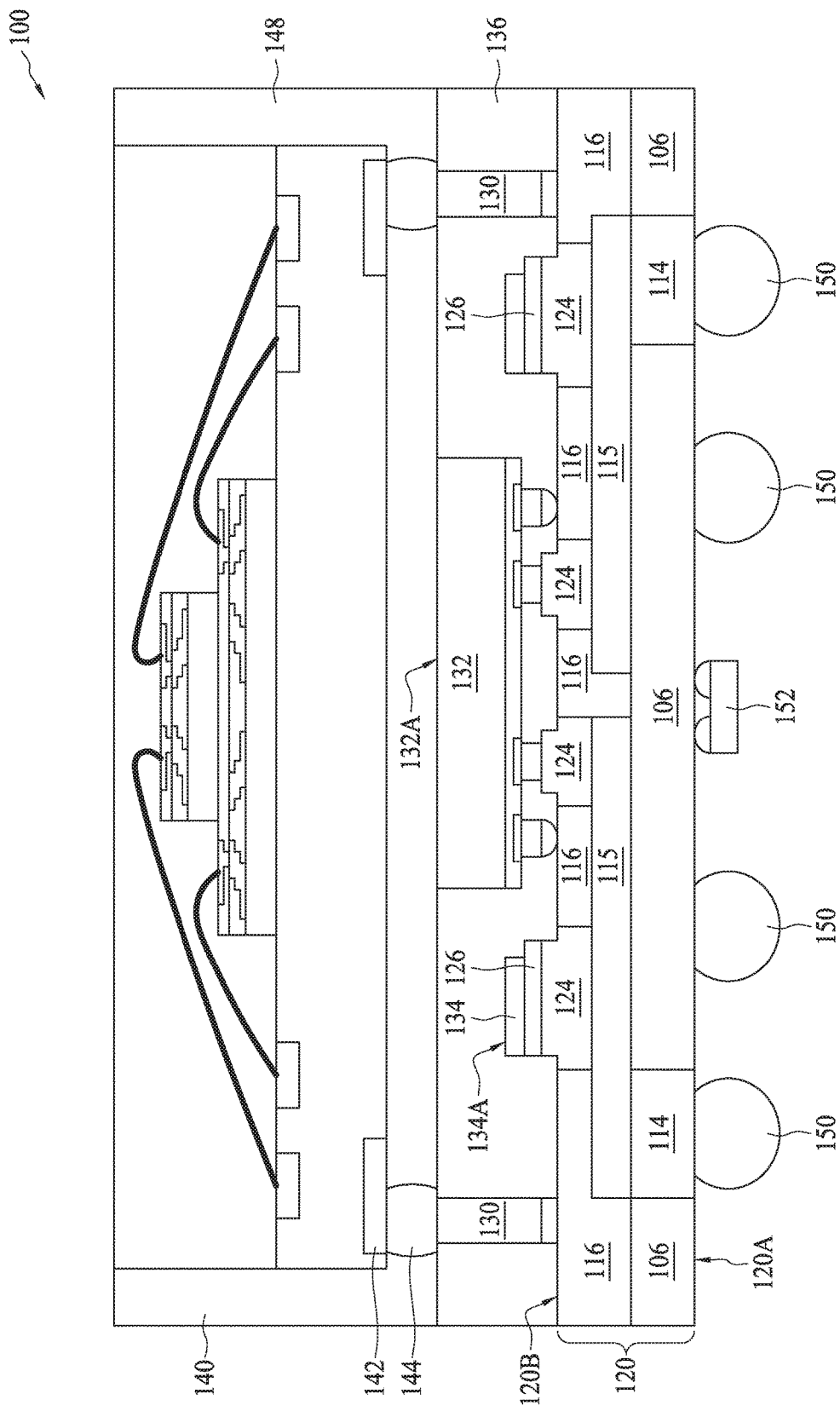
FIG. 1A is a schematic view of a semiconductor packaged structure in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above." "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure presents a semiconductor structure and manufacturing methods thereof, in which an interconnect layer (sometimes referred to as routing metal layer, redistribution layer) is formed over a carrier initially prior to the bonding between the dies and the interconnect layer. The intermediate stages of forming the semiconductor packaged structure are illustrated. Some variations of some embodiments are also discussed. Like reference numbers are used throughout various views and embodiments to designate like elements.

FIG. 1A is a schematic perspective view of a semiconductor packaged structure 100 in accordance with various embodiments of the present disclosure. In some embodiments, the semiconductor packaged structure 100 is a package on package (PoP) structure including at least one or more component packages or dies. In some embodiments, the semiconductor packaged structure 100 may include discrete active or passive components electrically connected with the semiconductor dies. In accordance with some embodiments, the semiconductor packaged structure 100 includes an integrated fan-out (InFO) structure in which semiconductor dies or components are stacked and electrically connected through conductive features.

Referring to FIG. 1A, the semiconductor packaged structure 100 comprises an interconnect layer 120, a first semiconductor die 132, a second semiconductor die 140, integrated passive devices (IPDs) 134 and 152, a plurality of conductive pillars 130 and a plurality of connectors 144 and 150.

In accordance with some embodiments, the first semiconductor die 132 and the second semiconductor die 140 each may be a substrate, a discrete die, or a packaged device. In accordance with some embodiments, the first semiconductor die 132 and the second semiconductor die 140 each may comprise a substrate and interconnect layer (or alternatively referred to as metallization layer, redistribution layer, etc) or optional active devices and passive devices formed on the respective substrate. In accordance with some embodiments, the first semiconductor die 132 and the second semiconductor die 140 each may comprise one or more component dies or chips with encapsulating materials. In accordance with some embodiments, the first semiconductor die 132 and the second semiconductor die 140 each may be a packaged structure comprising conductive bumps, pads or bonding wires.

In some embodiments, the IPD 134 may be a passive component, such as capacitor, inductor, resistor, or the like. In some embodiments, the IPD 134 may comprise a fuse or anti-fuse component. Although the term "IPD" is used throughout the present disclosure, an active device, such as a power management circuit, may be alternatively disposed instead of the IPDs 134 or 152.

The interconnect layer 120 is configured to electrically connect the overlying components thereof, such as the first semiconductor die 132, the IPDs 134 or the second semiconductor die 140. In addition, the interconnect layer 120 is configured to electrically couple the overlying components with the connectors 150 or the IPDs 152. The interconnect layer 120 may include multiple metal layers. Each of the metal layers may include conductive wires or lines and is electrically coupled to an adjacent overlaying or underlying metal layer through metal vias. In the present embodiment, several spaced metal lines 115 are disposed in the interconnect layer 120 and are interconnected through corresponding metal vias 114 and 124. In some embodiments, the metal lines 115, and the metal vias 114 and 124 are formed of conductive materials, such as copper, silver, gold or tungsten. The numbers and patterns of the metal layers and vias of the interconnect layer 120 are provided for illustration only. Other numbers of metal layers, metal vias, or conductive wires and alternative wiring patterns are also within the contemplated scope of the present disclosure.

Moreover, the aforesaid metal layers and metal vias are electrically insulated from other components. The insulation may be achieved by insulating materials. In some embodiments, the remaining portion of the interconnect layer 120 may be filled with inter-metal dielectric (IMD) layers 106 and 116. The dielectric material of the IMD layers 106 and 116 may be formed of oxides, such as un-doped Silicate Glass (USG), Fluorinated Silicate Glass (FSG), low-k dielectric materials, or the like. The low-k dielectric materials may have k values lower than 3.8, although the dielectric materials of the IMD 106/116 may also be close to 3.8. In some embodiments, the k values of the low-k dielectric materials are lower than about 3.0, and may be lower than about 2.5. In accordance with some embodiments, the dielectric layer 106 or 116 comprises a polymer material.

Several conductive pads 126 are disposed over the respective metal vias 124 of the interconnect layer 120. The conductive pads 126 may be connected to the exposed metal vias 124 of the interconnect layer 120 on a top surface 120B. In some embodiments, a subset of the conductive pads 126 are bonded to other components, such as the first semiconductor die 132. In some embodiments, a subset of the conductive pads 126 are used as test terminals (i.e., test pad) configured to receive test patterns.

The first semiconductor die 132 is disposed over the interconnect layer 120. In accordance with some embodiments, at least one IPD 134 is bonded to the interconnect layer 120 on the top surface 120B of the first semiconductor die 132. In accordance with some embodiments, at least one IPD 134 is bonded to the interconnect layer 120 on the surface 120B opposite to the connectors 150. In accordance with some embodiments, at least one IPD 152 and the first semiconductor die 132 are bonded to the interconnect layer 120 at the bottom surface 120A.

In accordance with some embodiments, the IPD 134 and the first semiconductor die 132 have different heights. The IPD 134 has a first height, measured from a top surface 134A to the top surface 120B of the interconnect layer 120, different than a second height of the first semiconductor die 132, in which the second height is measured from a top surface 132A to the top surface 120B of the interconnect layer 120. In some embodiments, the second height of the first semiconductor die 132 is greater than the first height of the IPD 134. The IPD 152 may be disposed vertically below the first semiconductor die 132 such that the length of connections between them may be shortened to an order of less than 100 μm, as compared to the interconnection between the IPD 134 and the first semiconductor die 132 in the order of several millimeters.

The conductive pillars 130 are disposed over the interconnect layer 120. In accordance with some embodiments, the conductive pillars 130 are bonded to the top surface 120B of the interconnect layer 120. The conductive pillars 130 may be spaced apart from the first semiconductor die 132 or the conductive pads 126. In some embodiments, the conductive pillars 130 may include conductive materials such as gold, silver, aluminum, titanium, copper, tungsten, nickel, chromium, and an alloy thereof. In some embodiments, the conductive pillars 130 have a third height greater than the first height of the first semiconductor die 132. In some embodiments, the third height of the conductive pillar 130 is greater than the second height of the IPD 134. The third height may be various for different applications. In accordance with some embodiments, the third height is between about 200 μm and about 250 μm.

The second semiconductor die 140 is disposed over the interconnect layer 120. In some embodiments, the first semiconductor die 132 is arranged between the interconnect layer 120 and the second semiconductor die 140. The second semiconductor die 140 is bonded to the interconnect layer 120 through the conductive pillars 130. In the present embodiments, the second semiconductor die 140 comprises a plurality of conductive pads 142 facing the interconnect layer 120. The conductive pads 142 may be aligned with the respective conductive pillars 130 and electrically connected thereto through the connectors 144.

The connectors 144 are disposed between the conductive pillars 130 and the second semiconductor die 140. In addition, the connectors 150 are disposed adjacent to a bottom surface 120A of the interconnect layer 120. The connectors 144 or 150 may be contact bumps such as controlled collapse chip connection (C4) bumps, ball grid array bumps or microbumps. The connectors 144 and 150 may comprise a conductive material such as tin, copper, gold, or silver.

In the semiconductor packaged structure 100, an encapsulating material 136 fills spaces among the first semiconductor die 132, the interconnect layer 120, the IPDs 134 and the conductive pillars 130. In accordance with some embodiments, the encapsulating material 136 can be a molding material or molding underfill material. In accordance with some embodiments, the encapsulating material 136 is configured to surround the first semiconductor die 132 and the IPDs 134. In some embodiments, a top surface 132A of the first semiconductor die 132 is exposed from the encapsulating material 136. In accordance with some embodiments, the encapsulating material 136 fills a space between the first semiconductor die 132 and the interconnect layer 120. The encapsulating material 136 may be a molding compound resin such as polyimide, PPS, PEEK, PES, a heat resistant crystal resin, or combinations thereof.

In some embodiments, another encapsulating material 148 encapsulates the second semiconductor die 140. In accordance with some embodiments, the encapsulating material 148 may surround the second semiconductor die 140 laterally. In accordance with some embodiments, the encapsulating material 148 fills a gap between the first semiconductor die 132 and the second semiconductor die 140. In some embodiments, a sidewall edge of the encapsulating material 148 is aligned with a sidewall edge of the encapsulating material 136. In some embodiments, a sidewall edge of the encapsulating material 148 or 136 is aligned with a sidewall edge of the interconnect layer 120. The encapsulating material 148 may be a molding compound resin such as polyimide, PPS, PEEK, PES, a heat resistant crystal resin, or combinations thereof. In some embodiments, the encapsulating material 148 may comprise a same material as the encapsulating material 136.

Figure 1B:
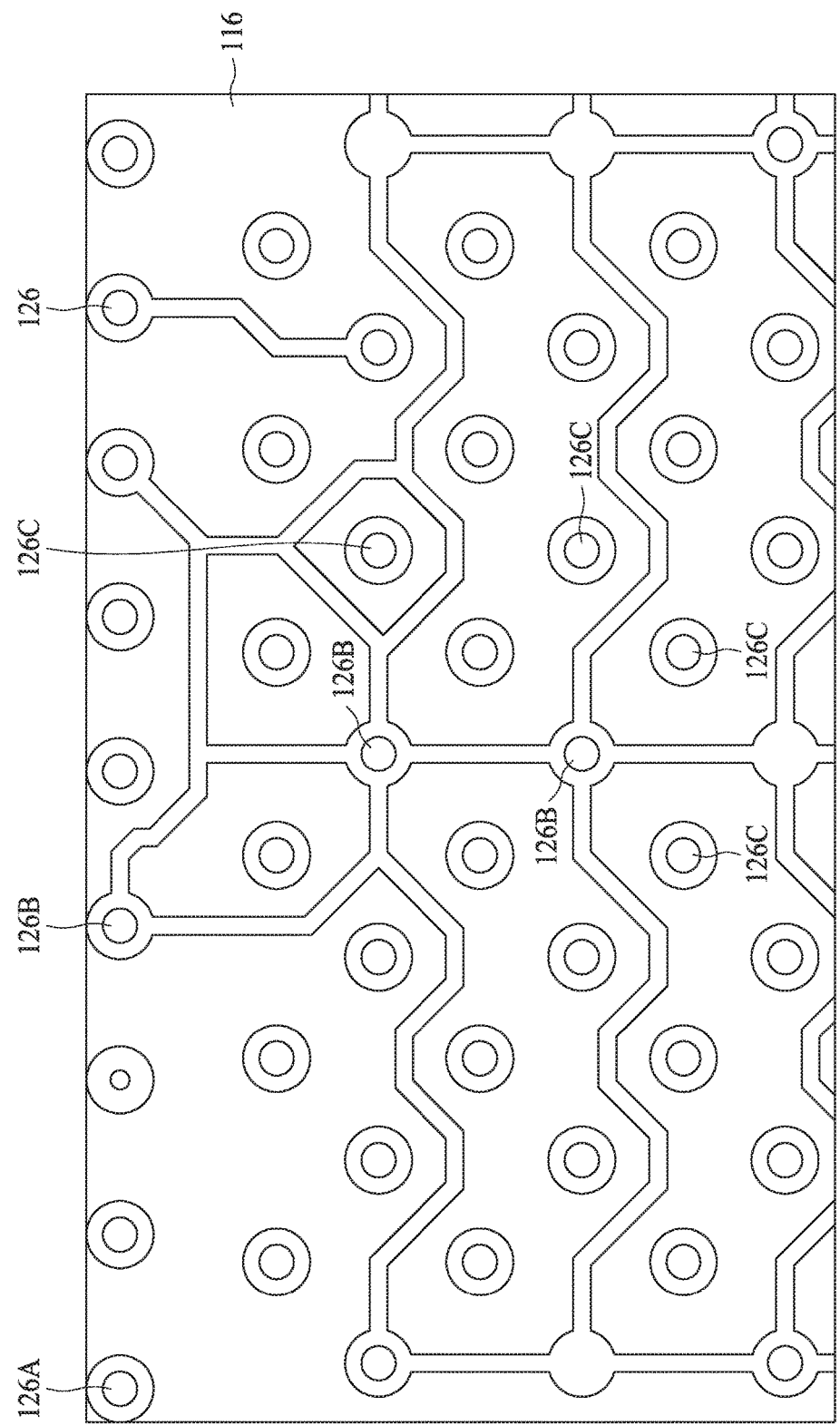
FIG. 1B is a cross-sectional top view of the semiconductor packaged structure in FIG. 1A in accordance with various embodiments of the present disclosure.

FIG. 1B is a cross-sectional top view of a top surface 120B in the semiconductor packaged structure 100 in FIG. 1A, in accordance with various embodiments of the present disclosure. Referring to FIG. 1B, a topmost sublayer of the interconnect layer 120, as observed from the top surface 120B, comprises conductive pads 126 and IMD materials 116. As discussed previously, in some embodiments a subset of the conductive pads, for example pads 126A, are configured as test pads in order to receive test patterns. In accordance with some embodiments, conductive pads 126B/126C are configured as a power terminal or a ground terminal connected to a power voltage level or a ground voltage level, respectively. In some embodiments, some of the conductive pads, such as 126B, form a mesh layout distributed at a top layer adjacent to the surface 120B. The mesh layout comprises a larger layer area than an existing mesh layout formed on a surface of the corresponding die, such as the first semiconductor die 132. Accordingly, a better electrical shielding effect can be obtained.

Figure 2A:
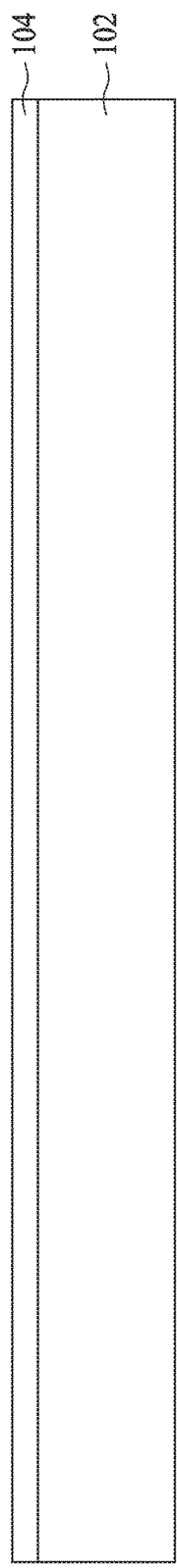
FIGS. 2A through 2R are cross-sectional views of intermediate structures for a method of manufacturing the semiconductor packaged structure in FIG. 1A, in accordance with various embodiments.
Figure 2B:
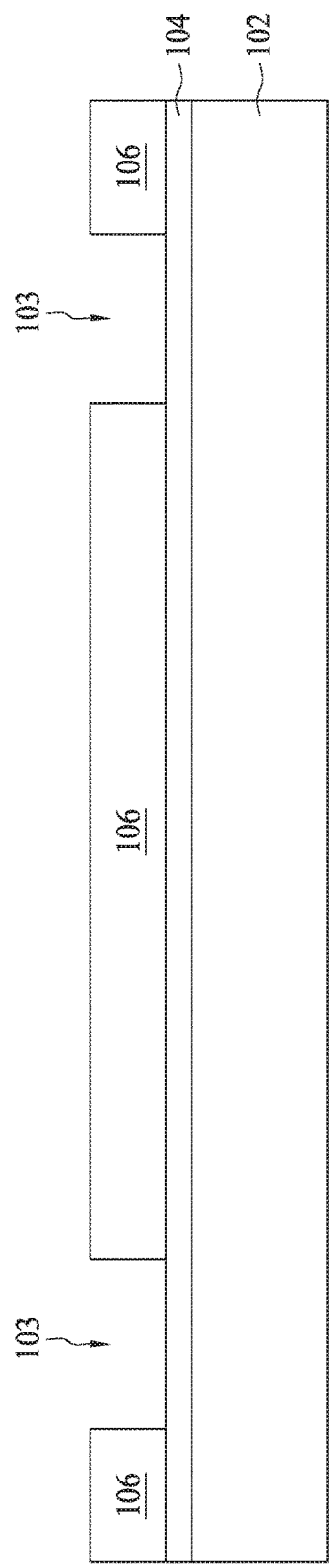
Figure 2C:
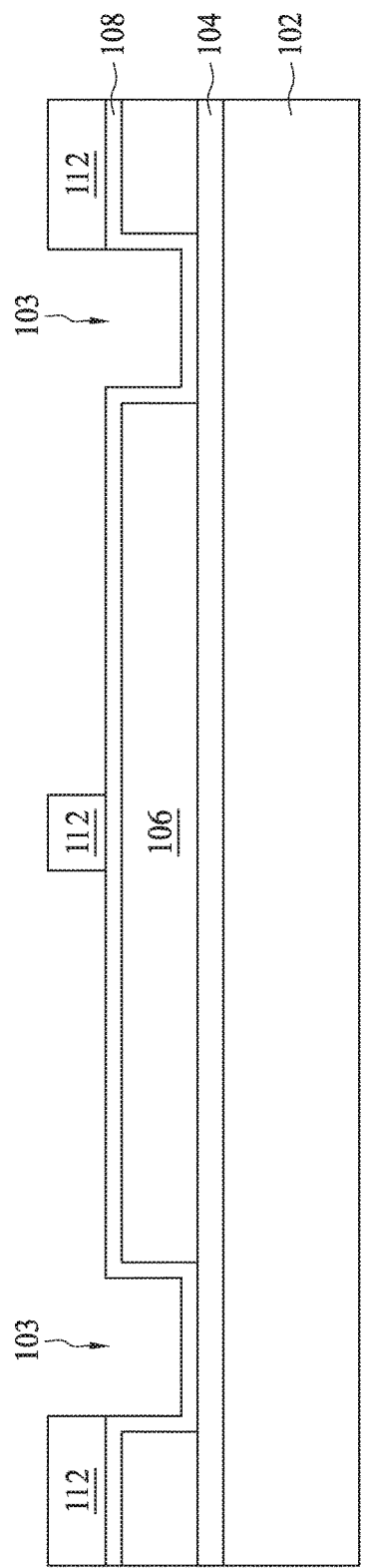
Figure 2D:
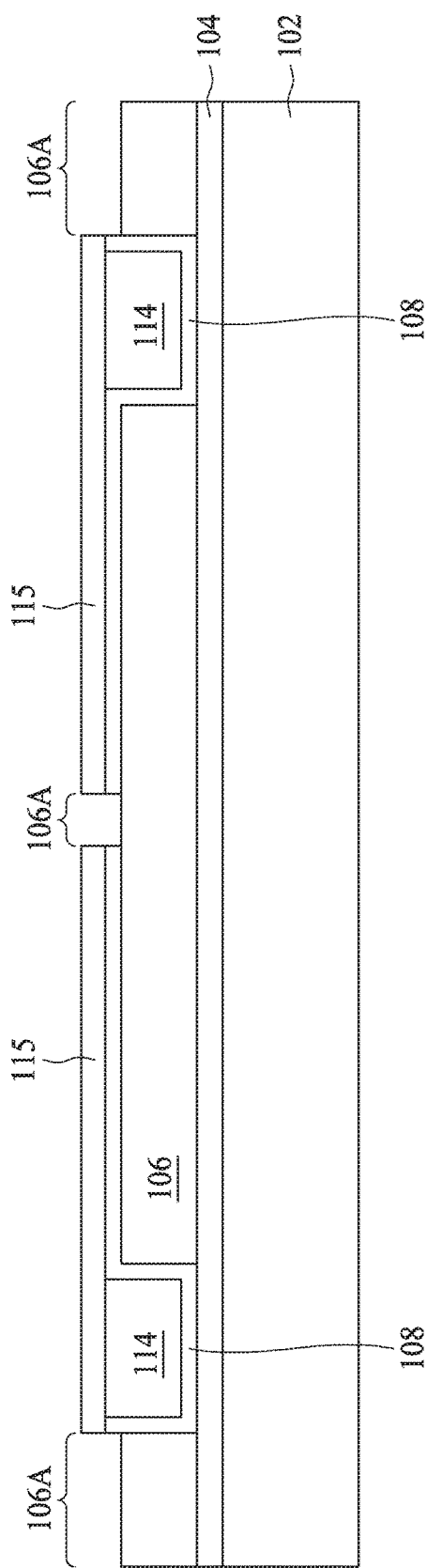
Figure 2E:
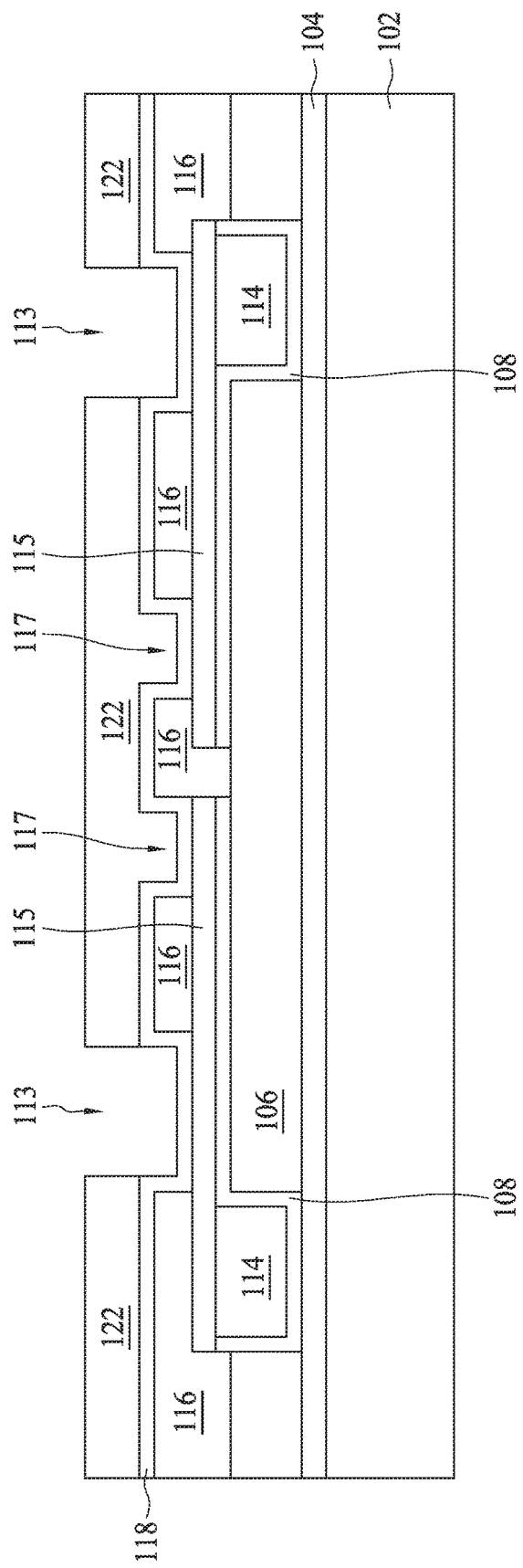
Figure 2F:
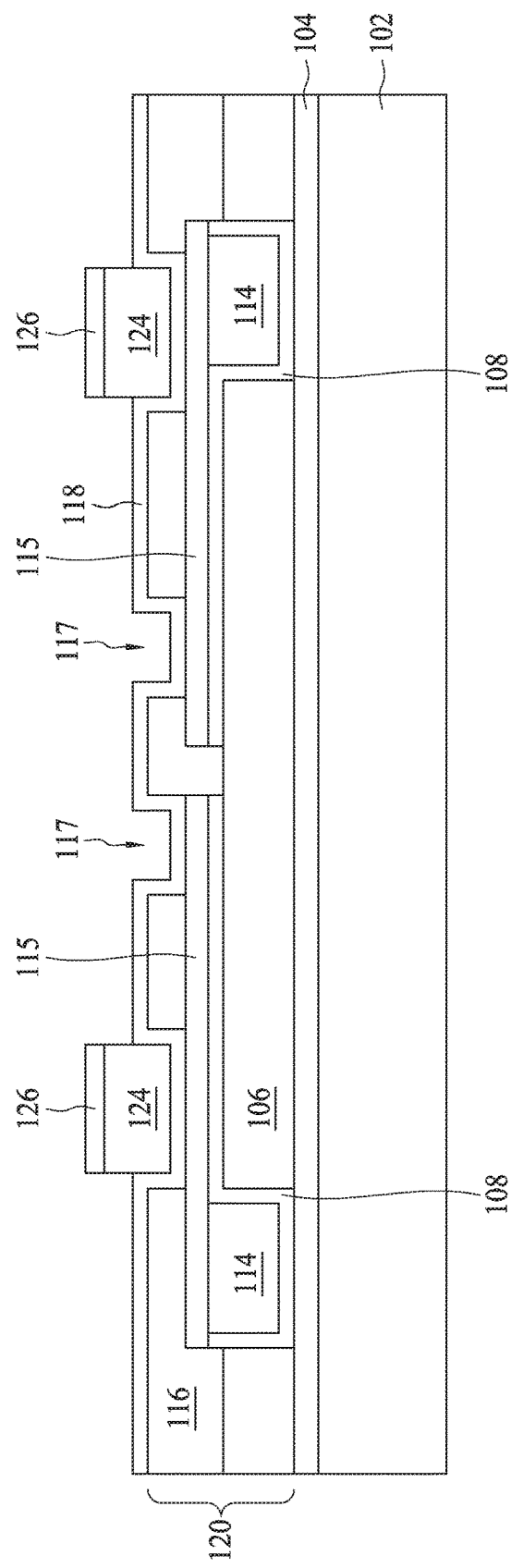
Figure 2G:
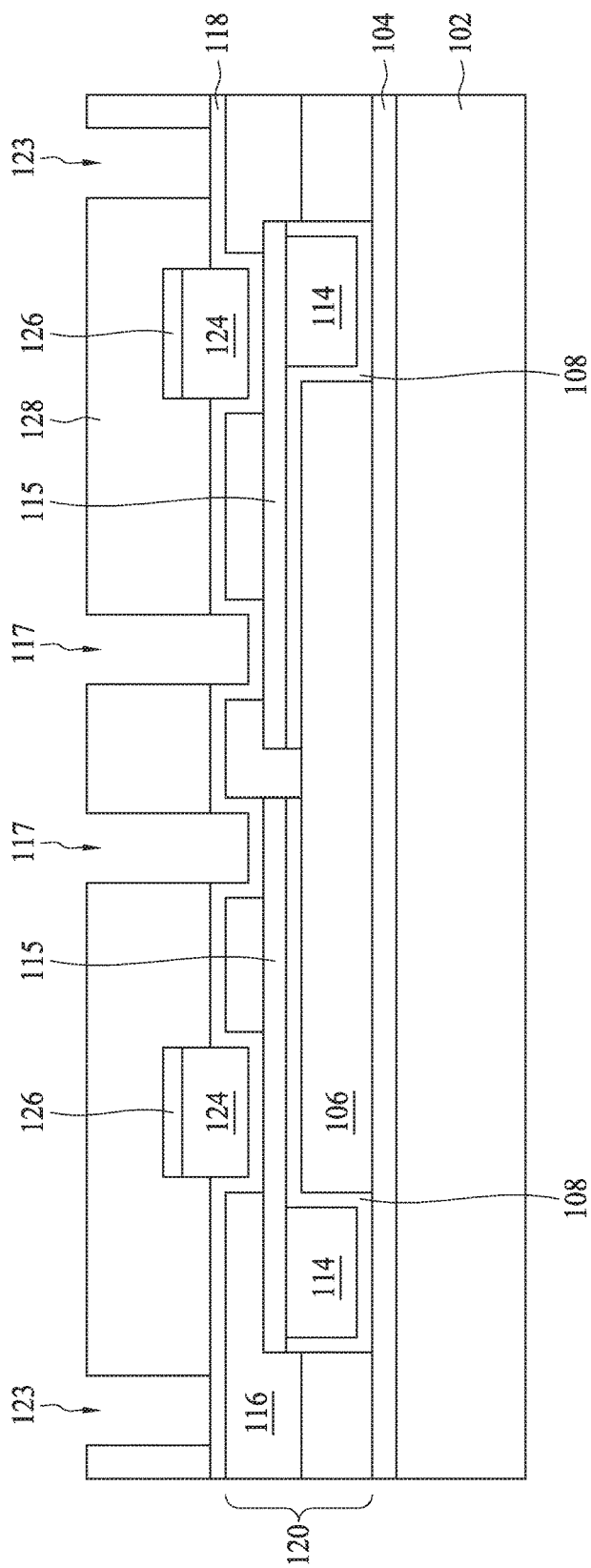
Figure 2H:
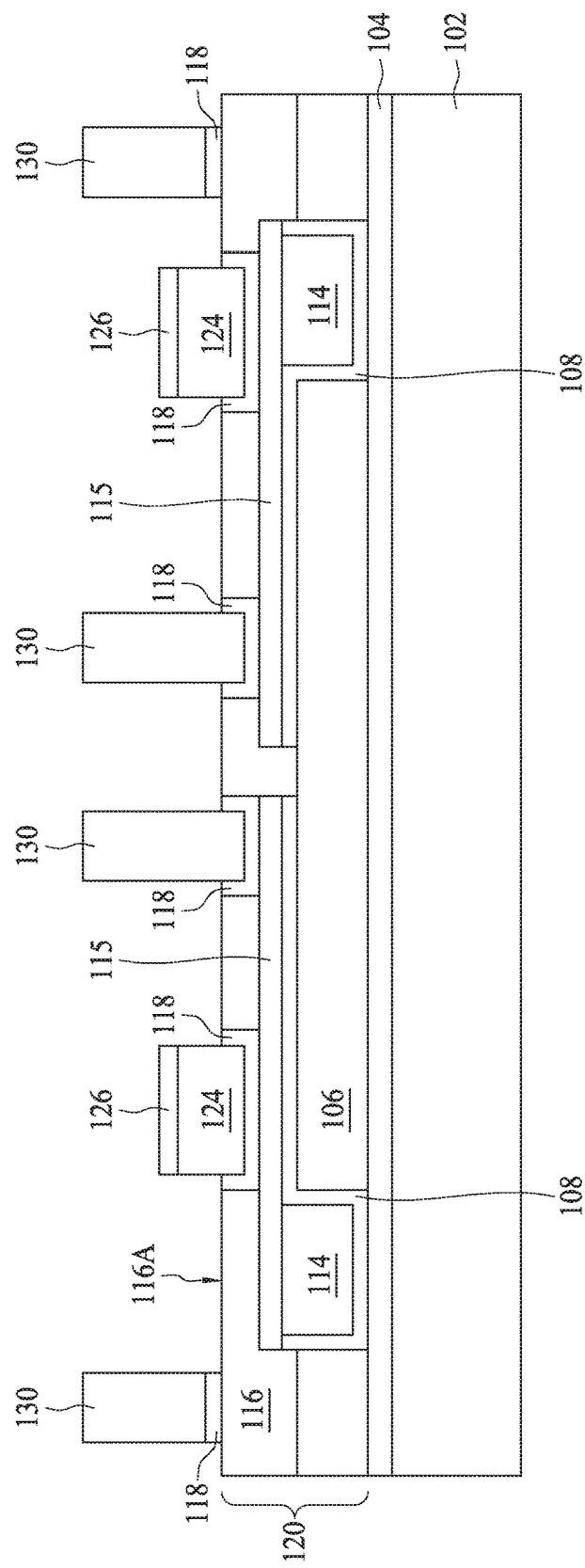
Figure 2I:
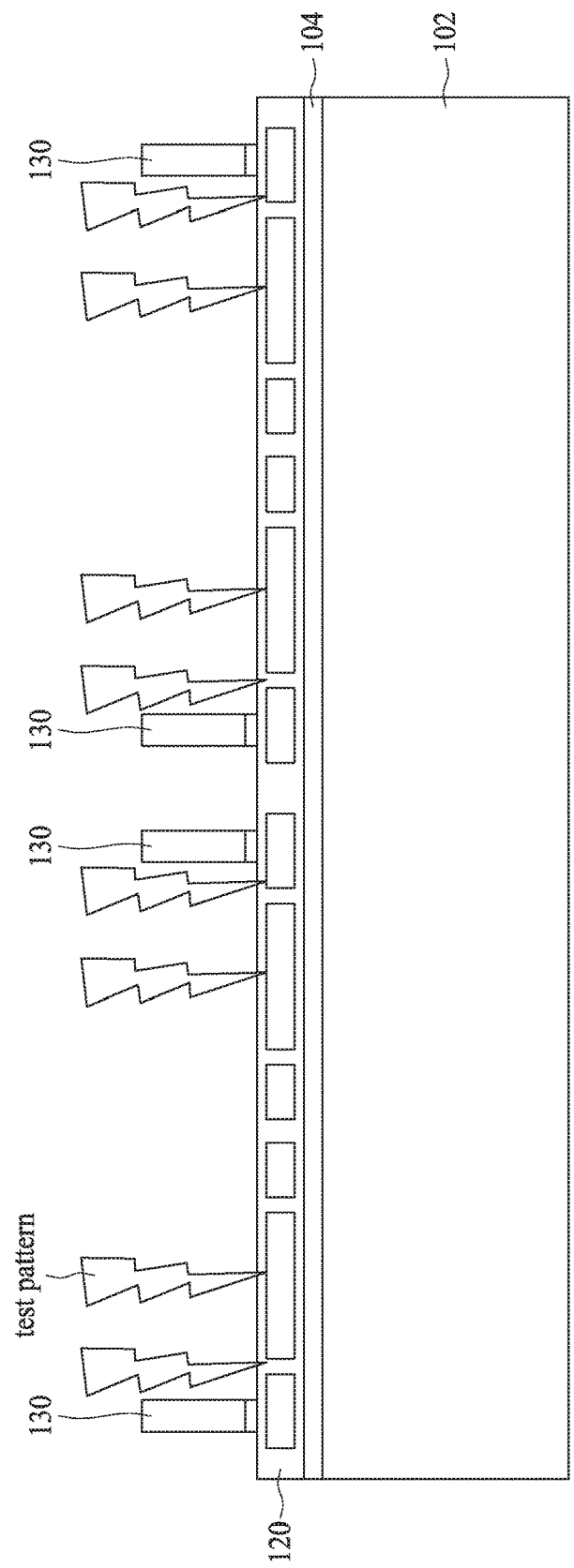
Figure 2J:
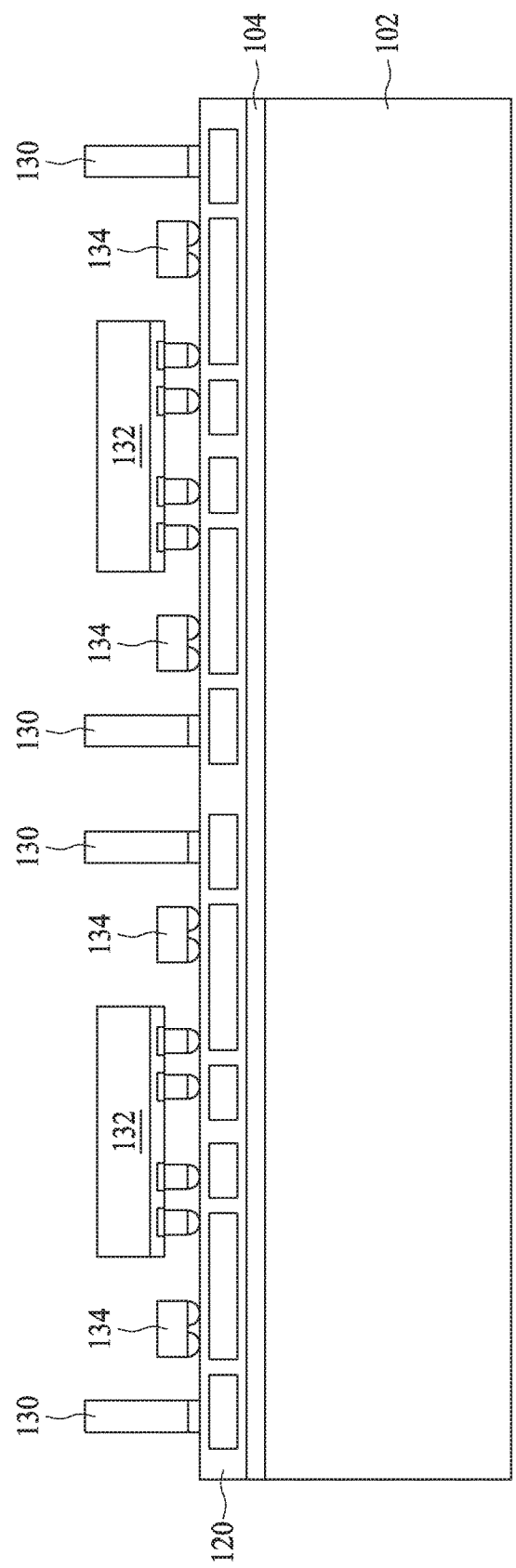
Figure 2K:
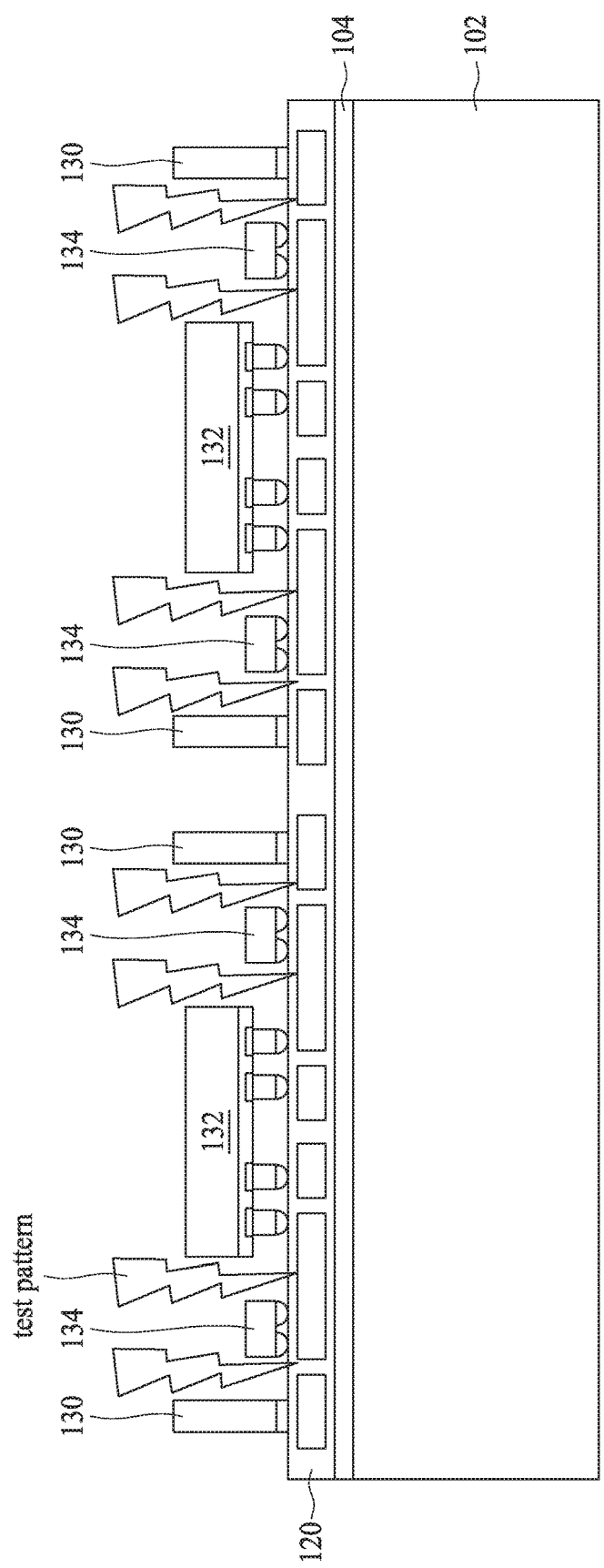
Figure 2L:
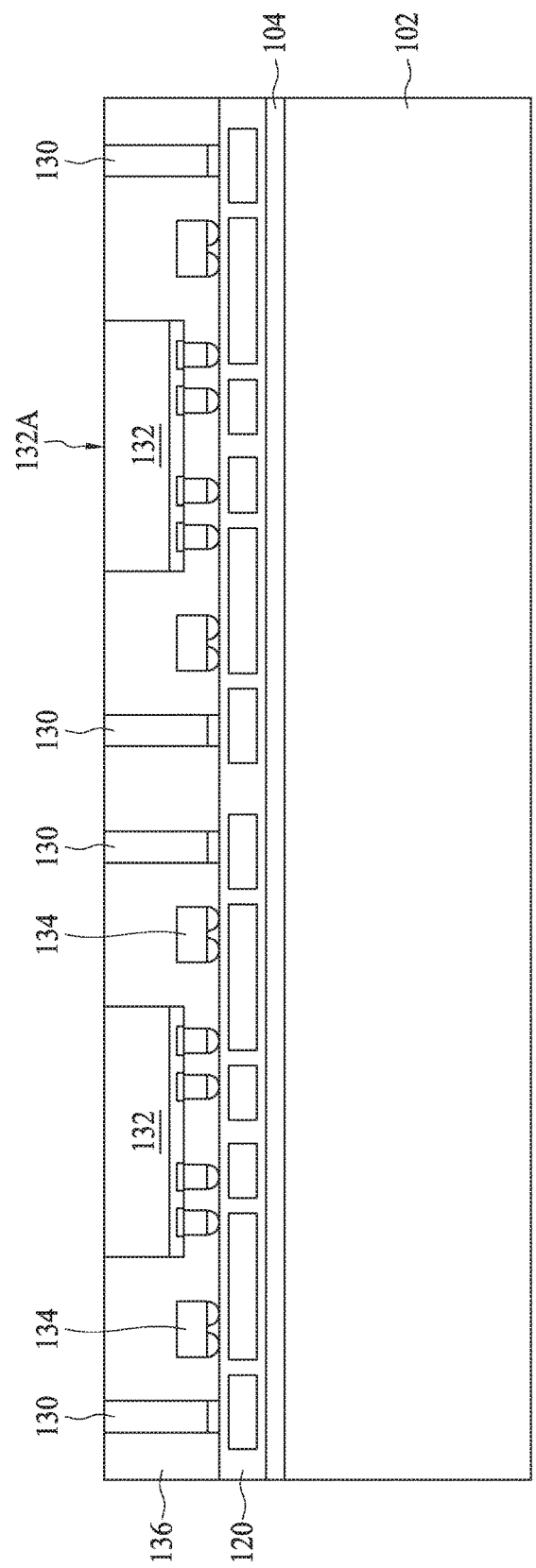
Figure 2M:
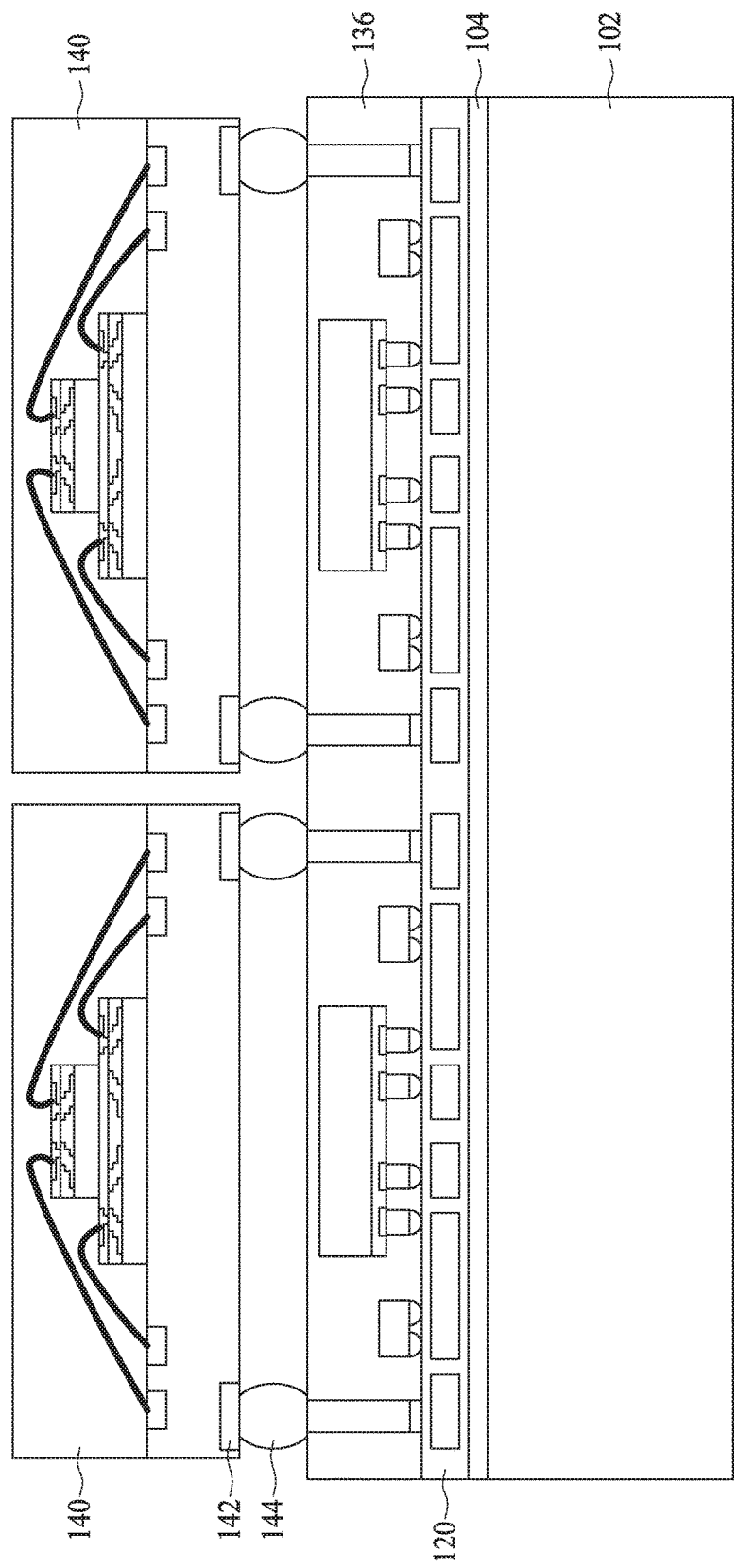
Figure 2N:
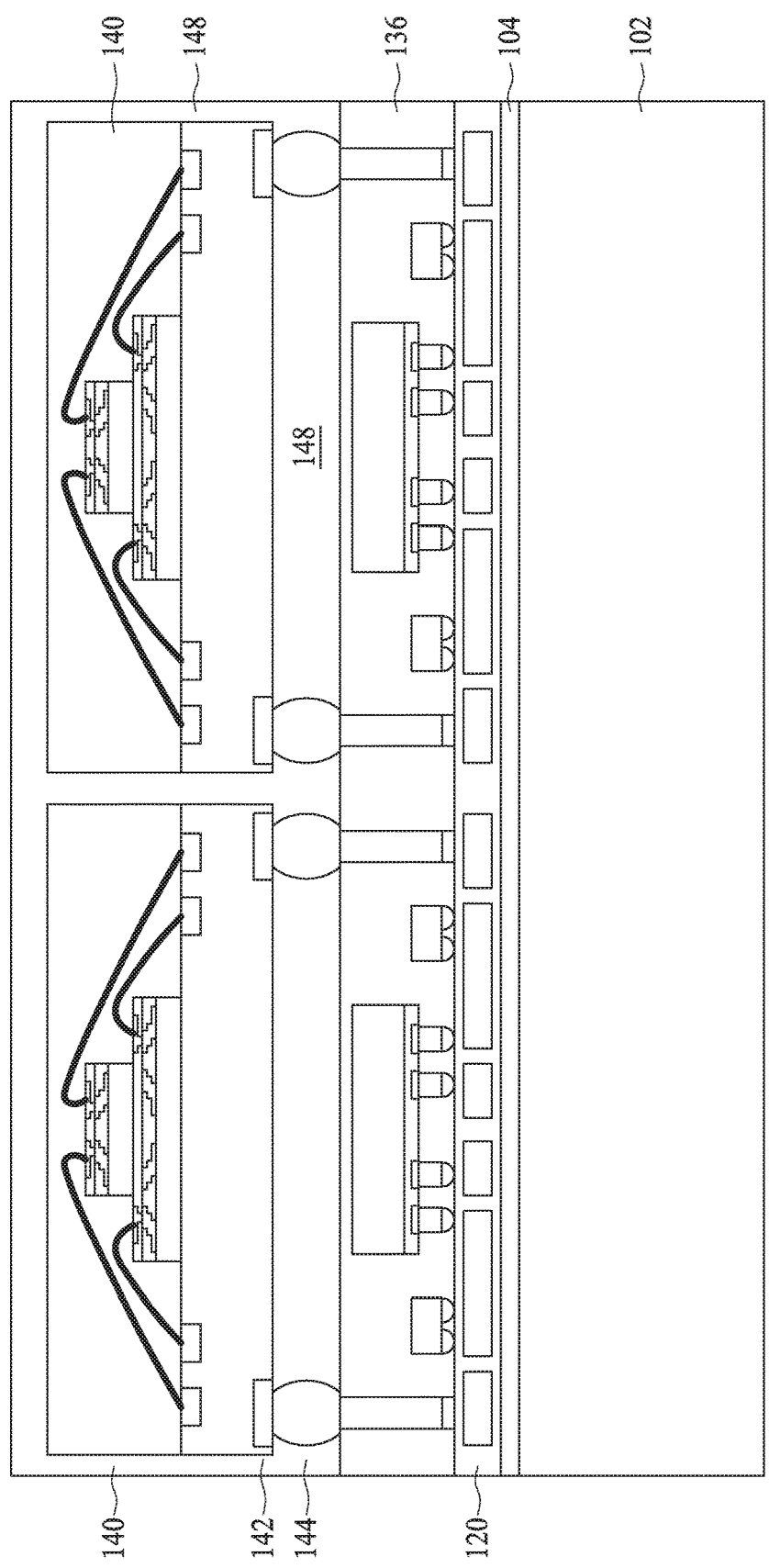
Figure 20:
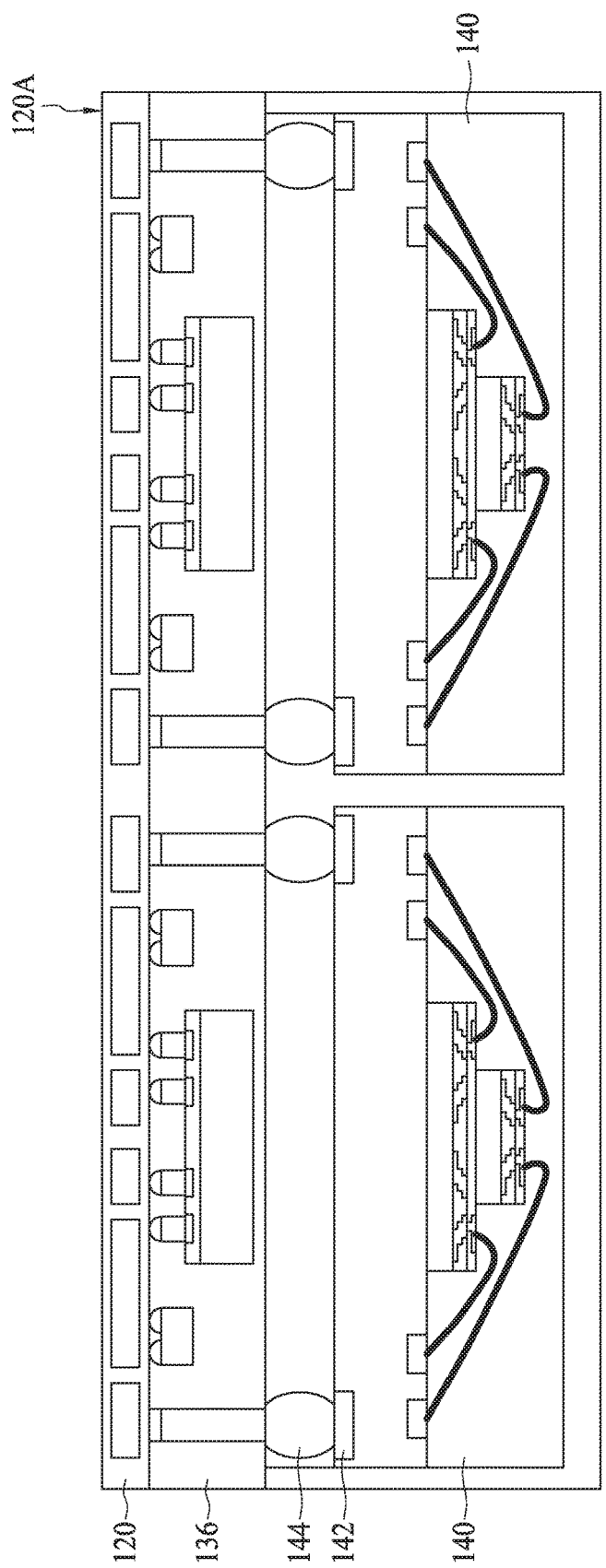
Figure 2P:
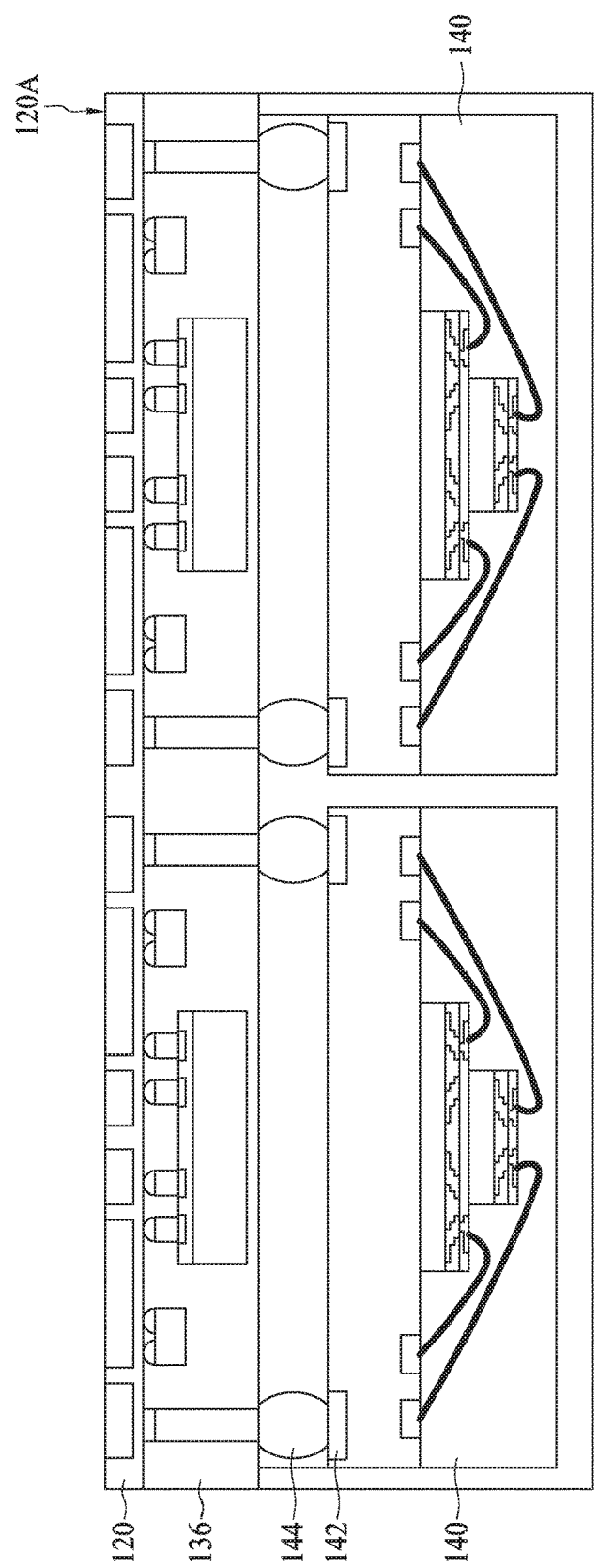
Figure 2Q:
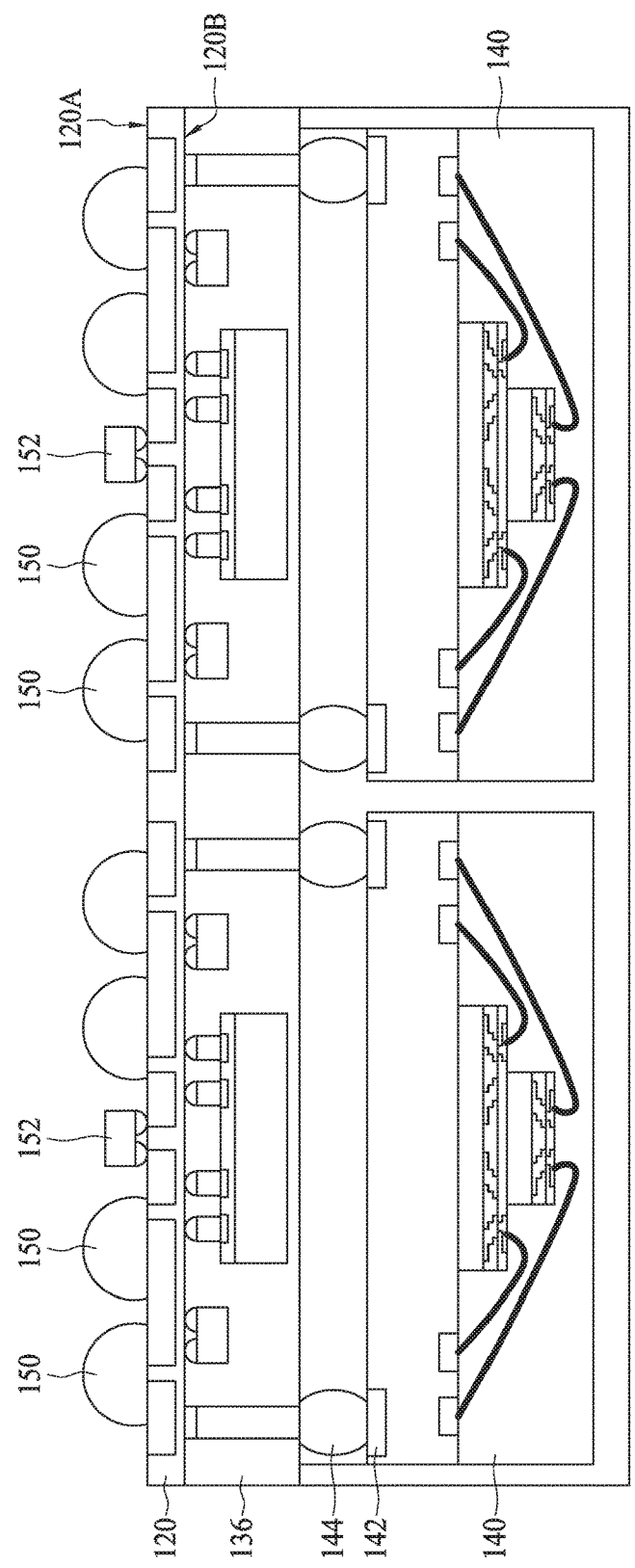
Figure 2R:
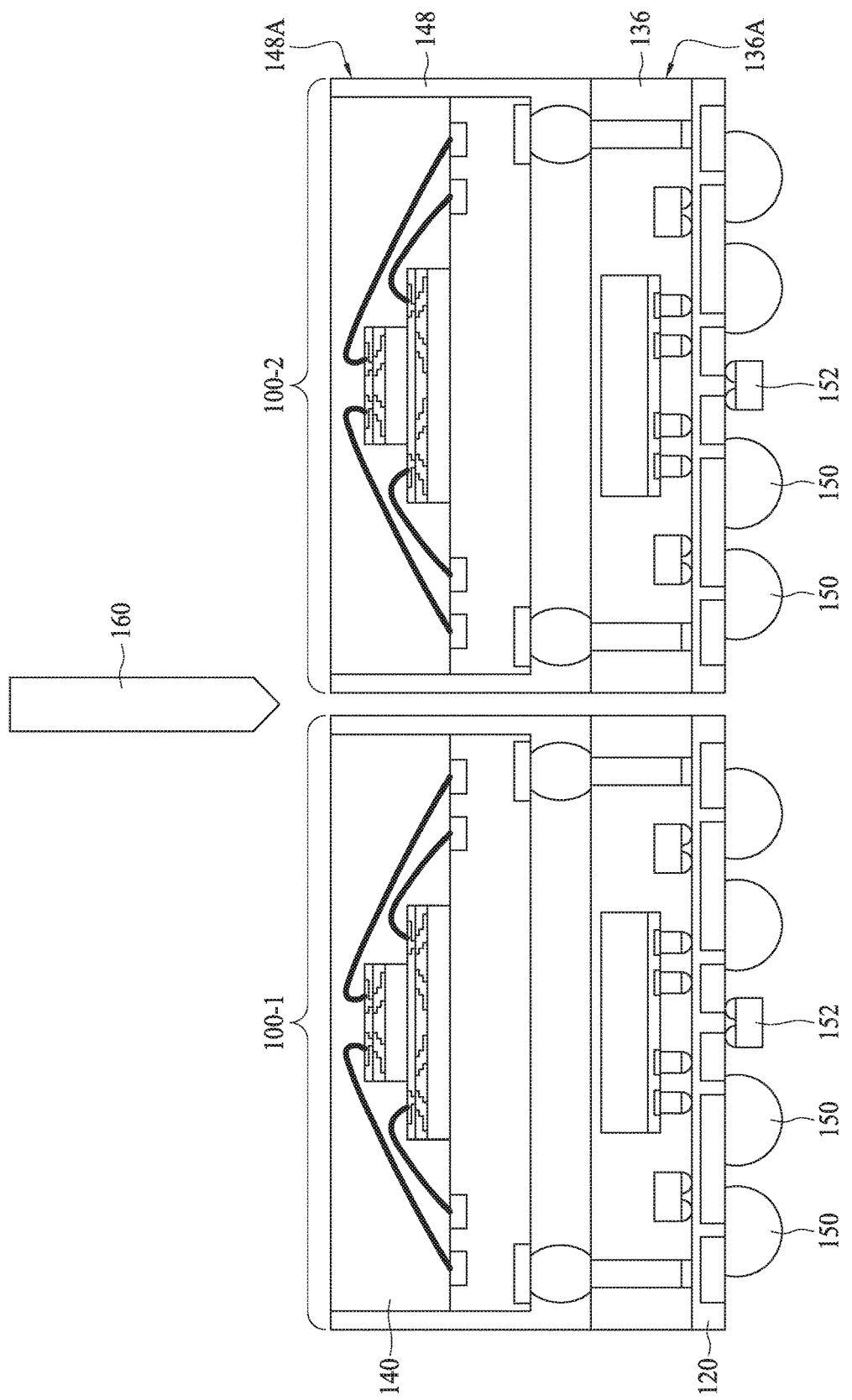
Figure 3:
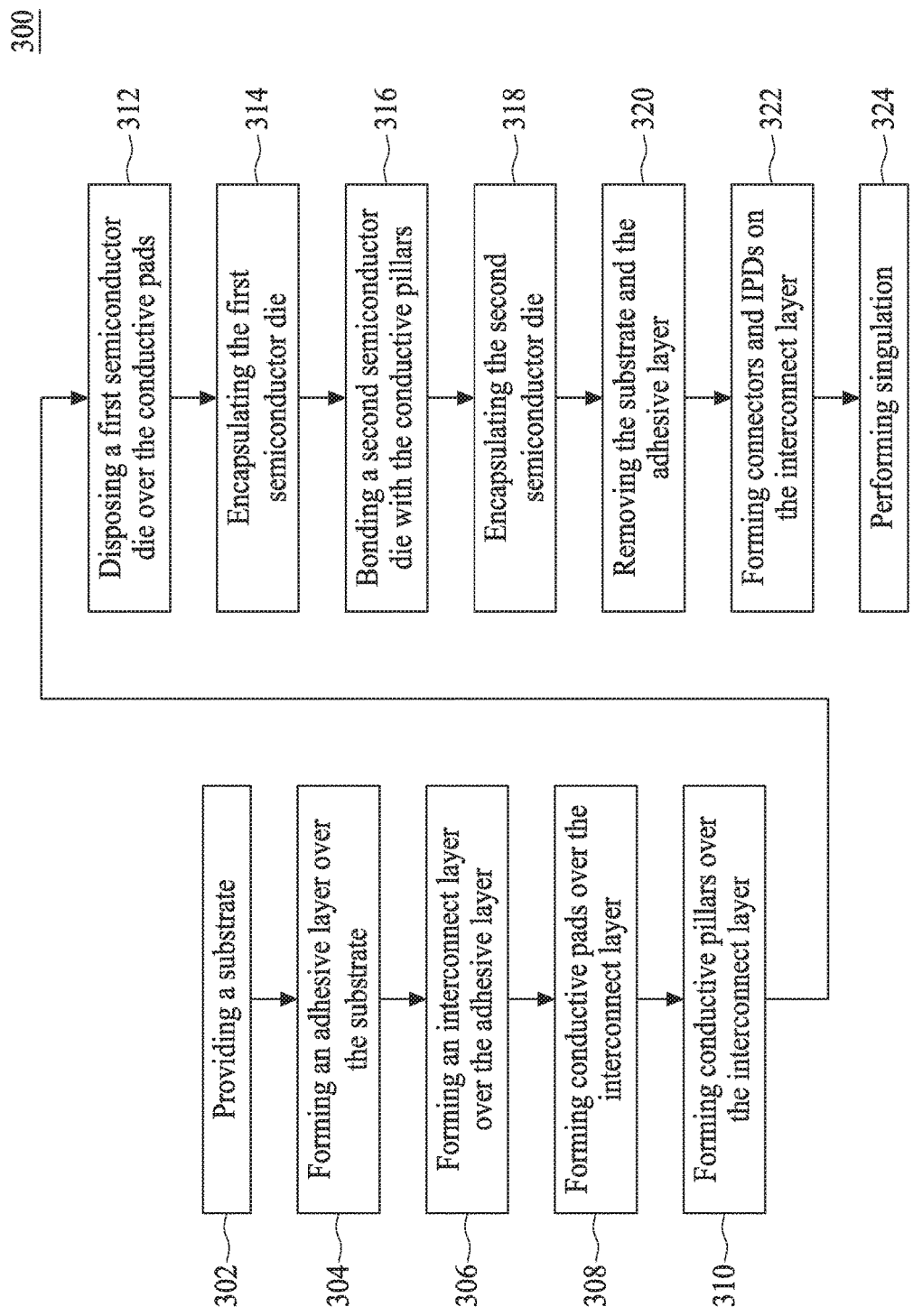
FIG. 3 is a flow diagram of manufacturing a semiconductor packaged structure in FIGS. 2A through 2R, in accordance with some embodiments.

FIGS. 2A through 2R are cross-sectional views of intermediate structures for a method of manufacturing a semiconductor packaged structure in FIG. 1A, in accordance with some embodiments. The operations shown in FIG. 2A through 2R are also illustrated schematically in the process flow 300 shown in FIG. 3.

In FIG. 2A, a substrate 102 is received or provided. The respective operation is shown as operation 302 of the process flow 300 in FIG. 3. The substrate 102 may be a carrier substrate. The substrate 102 may comprise, for example, silicon based materials, such as glass or silicon oxide; aluminum oxide, ceramic materials, or combinations thereof. The carrier substrate 102 comprises a planar top surface on which semiconductor components, such as a semiconductor die or IPDs, can be attached thereof.

Next, an adhesive layer 104 is formed over the substrate 102. The respective operation is shown as operation 304 of the process flow 300 in FIG. 3. The adhesive layer 104 is configured to assist in the adherence between the substrate 102 and the overlying layers. In some embodiments, the adhesive layer 104 may comprise ultra-violet glue whose adhesive strength, when exposed to ultra-violet light, would be degraded. In accordance with some embodiments, the adhesive layer 104 comprises other types of adhesives, such as pressure sensitive adhesives, radiation curable adhesives, epoxies, or combinations thereof. The adhesive layer 104 may be dispensed in a semi-liquid or gel form, and can be deformed under an external pressure.

In some embodiments, an additional polymer layer (not separately shown) may be optionally disposed over the adhesive layer 104. The polymer layer is used for protecting the overlying devices, such as a semiconductor die, from being damaged when a portion of the adhesive layer 104 is removed in subsequent operations. Alternatively, such additional polymer layer may be regarded as an initial polymer sublayer of a subsequently formed interconnect layer. In some embodiments, the polymer layer may be a protective material such as polybenzoxazole (PBO), polyimide (PI), benzocyclobutene (BCB), silicon oxide, silicon nitride, silicon oxynitride, or any other suitable protective material. The polymer layer may be formed using a spin-coating process or a deposition process (e.g., chemical vapor deposition), or other suitable process. In some embodiments, the polymer layer may be formed to a thickness between about 1 μm and about 100 μm, such as about 20 μm. In some embodiments, the polymer layer is alternatively formed with a dielectric material.

Referring to FIG. 2B through FIG. 2F, an interconnect layer is formed over the adhesive layer 104. The respective operation is shown as operation 306 of the process flow 300 in FIG. 3. The interconnect layer may comprise alternating layers of dielectric materials and conductive connections, in which the conductive connections comprising metal lines or wires and extending laterally are interconnected by vertically extending metal vias. In FIG. 2B, a patterned dielectric layer 106 is initially formed over the adhesive layer 104. The patterned dielectric layer 106 may be formed by a variety of techniques, e.g., chemical vapor deposition (CVD), low-pressure CVD (LPCVD), plasma-enhanced CVD (PECVD), sputtering and physical vapor deposition (PVD), thermal growing, and the like. The patterned dielectric layer 106 may be formed with a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), a polymer material, and the like. A photoresist (not shown) is patterned over the dielectric layer 106 for forming via holes 103. The photoresist is striped after the via holes 103 are formed.

Referring to FIG. 2C, a seed layer 108 is deposited over the patterned dielectric layer 106. The seed layer 108 is a thin layer of a conductive material for facilitating the formation of conductive features for the interconnect layer 120. In some embodiments, the seed layer 108 may comprise a titanium sublayer followed by a copper sublayer. The seed layer 108 may be formed using a suitable process, such as sputtering, evaporation, or deposition. In some embodiments, the seed layer 108 is blanketly over the dielectric layer 106.

Once the seed layer 108 is constructed, a mask layer 112 is disposed over the seed layer 108 in order to assist formation of other conductive features in the interconnect layer 120. The mask layer 112 may be a photoresist layer or a hard mask layer, such as a silicon nitride. The mask layer 112 may be formed by a variety of techniques, e.g., CVD, LPCVD, PECVD, sputtering, PVD, and the like.

In FIG. 2D, conductive vias 114 are formed in the via holes 103 with the mask layer 112 being the patterned mask. Further, conductive lines 115 are formed to connect conductive vias 114 and extend laterally over the seed layer 108. The conductive vias 114 and the conductive lines 115 comprise one or more conductive materials, such as copper, tungsten, or other conductive metals, and may be formed by electroplating, electroless plating, or any suitable process. Once the conductive vias 114 and conductive lines 115 have been formed, the mask layer 112 may be removed thereafter. Moreover, a portion of the seed layer 108, which is over the dielectric layer 106 while exposed without being covered by the conductive vias 114 or the conductive lines 115, is removed by, for example, an etching process, so as to expose the dielectric layer 106. Accordingly, a portion of the top surface, such as that labelled as 106A, for the dielectric layer 106 is exposed.

Referring FIG. 2E, a second dielectric layer 116 and a second seed layer 118 are subsequently formed over the dielectric layer 106, the conductive vias 114 and conductive lines 115. The second dielectric layer 116 may be in contact with the dielectric layer 106 at the portion 106A of the top surface for the dielectric layer 106. In some embodiments, the dielectric layer 116 may partially cover the conductive lines 115. The materials and formation processes for the second dielectric layer 116 and the second seed layer 118 are similar to those applied to the dielectric layer 106 and the seed layer 108, respectively, and will not be repeated for the sake of simplicity.

In some embodiments, a patterned photoresist layer (not separately shown) is disposed over the dielectric layer 116 so as to form via holes 113 and 117. The patterned photoresist layer may be stripped once the via holes 113 and 117 are formed. In some embodiments, the seed layer 108 may be formed as a blanket layer disposed over the dielectric layer 116 and the conductive lines 115, and lining the via holes 113 and 117. Next, another patterned photoresist layer 122 is formed over the seed layer 118, in which via holes 113 are exposed from the patterned photoresist 122 while via holes 117 are covered.

In FIG. 2F, conductive vias 124 are formed by filling conductive materials, such as copper or tungsten, in the exposed via holes 113. The conductive vias 124 may be formed using a suitable process, such as electrochemical plating, electro-less plating, sputtering, or deposition. The composite structure, which comprises the conductive features 114, 115, 124, dielectric layers 106 and 116, and optional seed layers 108 and 118, are collectively referred to as the interconnect layer 120 throughout the disclosure.

Subsequently, conductive pads 126 are formed over the respective conductive vias 124 of the interconnect layer 120. In some embodiments, the conductive pads 126 are formed of a conductive material such as aluminum, copper, tungsten, or the like. The respective operation is shown as operation 308 of the process flow 300 in FIG. 3. The conductive pads 126 may be formed using a process such as CVD or PVD, although other suitable materials and methods may alternatively be utilized. The formation for the conductive pads 126, after the conductive material has been formed, may further involve a removal operation, such as using an etching process, for removing the patterned photoresist 122.

Referring to FIG. 2G, another patterned photoresist layer 128 is formed over the conductive pads 126 and the seed layer 118. Some via holes, such as via holes 117 are extended upwardly through the photoresist layer 128, thus the via holes 117 are exposed from the photoresist layer 128. In addition, some vias holes, such as via holes 123, spaced apart from the via holes 117, are also formed in the patterned photoresist 128. Vias holes 123 are offset from the prior via holes 117 and less deeper than via holes 117. In some embodiments, the photoresist layer 128 may alternatively formed of a dry film.

In FIG. 2H, conductive pillars 130 are formed over the seed layer 118 and in respective vias holes 117 and 123. The respective operation is shown as operation 310 of the process flow 300 in FIG. 3. Once the conductive pillars 130 are formed, the patterned photoresist layer 128 is removed.

Referring to FIG. 2H, some conductive pillars 130 are formed over the dielectric layer 116 with a seed layer 118 disposed therebetween. Also, some conductive pillars 130 are formed over the conductive lines 115 with a seed layer 118 disposed therebetween. Further, subsequent to the removal of the pattern photoresist layer 128, an exposed portion of the seed layer 118, which extends laterally above the dielectric layer 116 while not being covered by the conductive pillars 130, is also removed subsequent to the removal of the patterned photoresist layer 128. In some embodiments, a portion of the seed layer 118 extending vertically, which lines sidewalls of the via holes 117 in the dielectric layer 116, is retained. In some embodiments, a portion of the seed layer 118 lining bottoms of the via holes 117 is retained. In some embodiments, a portion of the dielectric layer 116 not covered by the conductive pillars 130 is exposed by removing the overlying seed layer 118. In some embodiments, a portion of the seed layer 118 lining sidewalls of the via holes 117 is coplanar with a top surface 116A of the dielectric layer 116.

The conductive pillars 130 may comprise different lengths. For example, the conductive pillars 130 (shown closer to the center of the packaged structure) electrically connected with the conductive lines 115 and extended to the dielectric layer 116 may have a length greater than those conductive pillars 130 (shown closer to the edge of the packaged structure) standing on the dielectric layer 116. In some embodiments, the conductive pillars 130 are substantially coplanar at the top level regardless of their lengths.

Referring to FIG. 2I, intermediate stages of the semiconductor packaged structure 100 are illustrated in this figure and subsequent figures, in which the details of the interconnect layer 120 are simplified. Upon completion of the interconnect layer 120, a first integrity test is performed against the interconnect layer 120. In some embodiments, the first integrity test is considered a partial test for the semiconductor packaged structure 100 in the absence of other interconnected devices, such as the first semiconductor die 132 and the second semiconductor dies 140 in FIG. 1A. The first integrity test may be performed by inputting test patterns through input terminals, such as test pads 126 in FIG. 1A, in order to identify defected structures (e.g., short circuit or open circuit) of the interconnect layer 120. As such, a proactive test focused on the interconnect layer 120 would help reduce the chances of manufacturing failures in the interconnect layer 120 prior to the attachment of the first semiconductor dies 132, the IPDs 134 and 152 or the second semiconductor dies 140. The cost for the good semiconductor dies 132 and 140 attached to the failed units in the interconnect layer 120 can thus be saved.

If the first integrity test is passed, at least one first semiconductor die 132 is disposed over the interconnect layer 120, as illustrated in FIG. 2J. The respective operation is shown as operation 312 of the process flow 300 in FIG. 3. In some embodiments, the first semiconductor dies 132 comprise conductive bumps bonded to some conductive pads 126 (not separately shown for simplicity while illustrated in FIG. 1A) of the interconnect layer 120. Additionally, at least one IPD 134, spaced apart from the conductive pads 126 bonded to the first semiconductor die 132, is disposed over and bonded to the interconnect layer 120 through some other conductive pads 126. The IPDs 134 are disposed between the conductive pillars 130 and the first semiconductive dies 132. In some embodiments, the thickness of the IPD 134 and the semiconductive die 132 are substantially different. The interconnect layer first approach in accordance with the instant disclosure enables flexible integration of components with different thicknesses in the same package.

Referring to FIG. 2K, once the first semiconductor dies 132 and the IPDs 134 are in place, a second integrity test is performed against the interconnected structure of the interconnect layer 120, the first semiconductor dies 132 and the IPDs 134. In some embodiments, the second integrity test is considered a partial test for the semiconductor packaged structure 100 in the absence of other interconnected devices, such as the second semiconductor dies 140. However, the second integrity test may provide a more comprehensive testing coverage than the first integrity test since more connection and bonding structures are finished. In a similar approach to the first integrity test, the proactive second test, which is focused on the interconnect layer 120, the first semiconductor dies 132 and the IPDs 134, would help detect potential connection failures in advance, and the cost for the attachment of good dies 140 to the failed units in the packaged structure 100 can thus be saved.

In FIG. 2L, in response to the second integrity test as being passed, an encapsulating material 136 encapsulates or surrounds the first semiconductor die 132. In some embodiments, the encapsulating material 136 surrounds the conductive pillars 130 and the IPDs 134. The respective operation is shown as operation 314 of the process flow 300 in FIG. 3. The encapsulation process may be performed in a molding device (not individually shown). For example, the intermediate semiconductor packaged structure 100 in FIG. 2K may be disposed within a cavity of the molding device. Then the encapsulating material 136 may be dispensed within the cavity before the cavity is hermetically sealed, or alternatively may be injected into the sealed cavity through an injection port.

Once the encapsulating material 136 has been formed, a thinning or planarization process may be performed for removing excess encapsulating materials 136. The thinning may be performed using a mechanical grinding or chemical mechanical polishing (CMP) process in order to level a top surface of the encapsulating material 136. In addition, a top surface 132A of the first semiconductor die 132 is exposed from the encapsulating material 136. Furthermore, a top portion for each of the conductive pillars 130 is exposed from the encapsulating material 136.

In FIG. 2M, the second semiconductors dies 140 are received or provided. The second semiconductor dies 140 are then disposed over the encapsulating material 136. The second semiconductor dies 140 are then bonded to the respective conductive pillars 130. The respective operation is shown as operation 316 of the process flow 300 in FIG. 3. In some embodiments, each of the second semiconductor dies 140 comprises conductive pads 142 bonded to the respective conductive pillars 130 through the connectors 144.

Referring to FIG. 2N, an encapsulating material 148 is applied to the second semiconductor dies 140. The encapsulating material 148 encapsulates or surrounds each of the second semiconductor dies 140. The respective operation is shown as operation 318 of the process flow 300 in FIG. 3. In accordance with some embodiments, the encapsulating material 148 surrounds each second semiconductor die 140 laterally. In accordance with some embodiments, the encapsulating material 148 fills a gap between the adjacent second semiconductor dies 140. In accordance with some embodiments, the encapsulating material 148 fills a gap between the first semiconductor dies 132 and their corresponding second semiconductor dies 140. In some embodiments, the encapsulating material 148 fills a gap between the second semiconductor dies 140 and the encapsulating material 136. In accordance with some embodiments, the encapsulating material 148 surrounds the connectors 144 and covers the top surface of the encapsulating material 136. In some embodiments, the encapsulating material 148 covers and is in contact with the top surface 132A of the first semiconductor die 132.

In FIG. 2O, the semiconductor packaged structure 100 is flipped. The substrate 102 is removed from the adhesive layer 104. The respective operation is shown as operation 320 of the process flow 300 in FIG. 3. In accordance with some embodiments, the adhesive layer 104 is exposed to an energy source, such as ultra-violet (UV) light, such that the adhesion is degraded and the substrate 102 is released from the semiconductor package structure 100. Once the substrate 102 is separated from the semiconductor packaged structure 110 the adhesive layer 104 is also removed. A surface 120A of the interconnect layer 120 opposite to the first semiconductor dies 132 is exposed accordingly.

In FIG. 2P, an upper portion of the interconnect layer 120 is removed from the surface 120A such that the interconnect layer 120 is thinned. A conductive portion, such as the conductive vias 114, (not separately shown while illustrated in FIG. 1A) is exposed from the surface 120A of the interconnect layer 120. In accordance with some embodiments, the interconnect layer 120 can be thinned by using an etching operation, such as a dry etching or wet etching operation.

In FIG. 2Q, the connectors 150 are formed on the surface 120A of the interconnect layer 120. The respective operation is shown as operation 322 of the process flow 300 in FIG. 3. In some embodiments, a tin layer can be initially formed on the interconnect layer 120 by any suitable method such as evaporation, electroplating, printing, solder transfer, or ball placement. After the tin layer has been formed, a reflow operation is performed where the solder material is to be shaped as desired. In some embodiments, the connectors 150 are formed on a side 120A opposite to the side 120B to which the first semiconductor dies 132 are attached. In accordance with some embodiments, at least one IPD 152 is disposed over the interconnect layer 120. The IPD 152 is bonded to some of the conductive vias 114 (not separately shown) along with the connectors 150 on a same side of the interconnect layer 120. In some embodiments, some IPDs 152 are disposed on a side 120A opposite to the side 120B to which the first semiconductor dies 132 are attached. In some embodiments, the IPDs 152 are aligned with the respective first semiconductor dies 132. In some embodiments, each of the IPDs 152 and each of the IPDs 134, which are disposed on opposite sides, are arranged in dislocated locations such that they are not aligned with each other across the interconnect layer 120.

The locations for disposing the IPDs 134 and 152 are considered while taking into account different requirements and applications. For example, IPDs 152 are aligned vertically with the first semiconductor dies 132 with a reduced interconnection length. Accordingly, the electrical property and the manufacturing cost may be improved. However, when an IPD, such as an IPD 134, is required to function in cooperation with the first semiconductor die 132 and the second semiconductor die 140, it may be better to place the IPDs 134 on the same side of the first semiconductor die 132 in order to decrease the routing length between the two semiconductor dies 132 and 140. Furthermore, the spare space on lateral sides of the first semiconductor die 132 can accommodate additional components. Thus, the placement density for the connectors 150 can be increased due to less IPDs occupying the space for the connectors 150, making the packaged structure 100 more compact. In some embodiments, although the first semiconductor dies 132 and the IPDs 134 may have different heights, both of them can be bonded to a same side (i.e., on the surface 120B) of the interconnect layer 120.

In FIG. 2R, a dicing or singulation operation is performed. The respective operation is shown as operation 324 of the process flow 300 in FIG. 3. In accordance with some embodiments, the singulation is performed using a blade 160. In accordance with some embodiments, the singulation operation is performed using a laser 160. In some embodiments, for each of the discrete packaged dies 100-1 and 100-2, a sidewall edge 136A of the encapsulating material 136 is coplanar with a sidewall edge 148A of the encapsulating material 148 as a result of the singulation operation.

FIGS. 2A through 2M followed by FIGS. 4A through 4E are cross-sectional views of intermediate structures for another method of manufacturing a semiconductor packaged structure, in accordance with some embodiments. The operations shown in FIG. 2A through 2M followed by FIGS. 4A through 4E are also illustrated schematically in the process flow 500 shown in FIG. 5. In the subsequent discussion, the operations shown in FIGS. 2A through 2M (corresponding to operations 302 through 316) are omitted for simplicity, while FIGS. 4A through 4E are discussed with reference to the corresponding operations in FIG. 5.

Figure 4A:
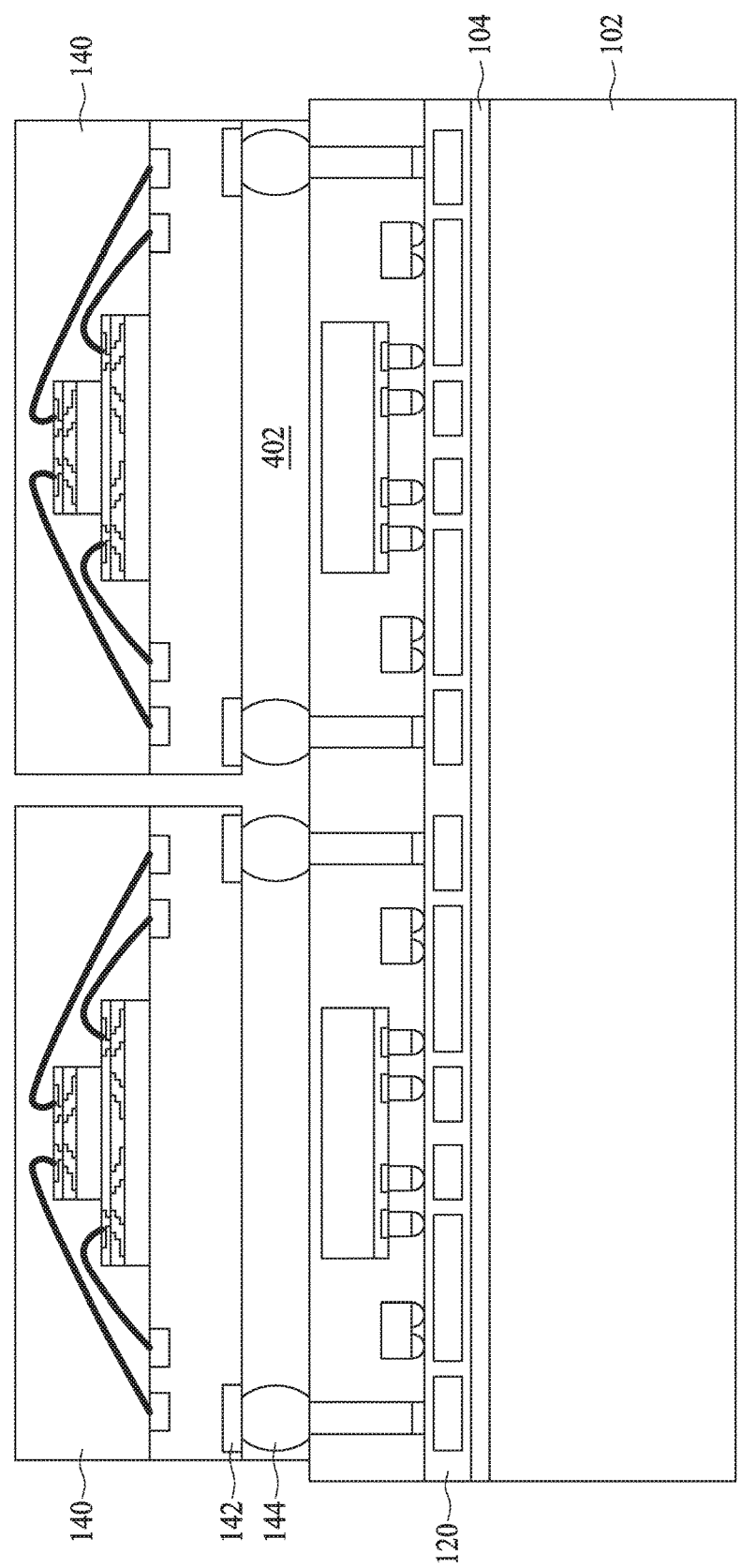
FIGS. 4A through 4E are cross-sectional views of some intermediate structures for a method of manufacturing a semiconductor packaged structure, in accordance with various embodiments.
Figure 5:
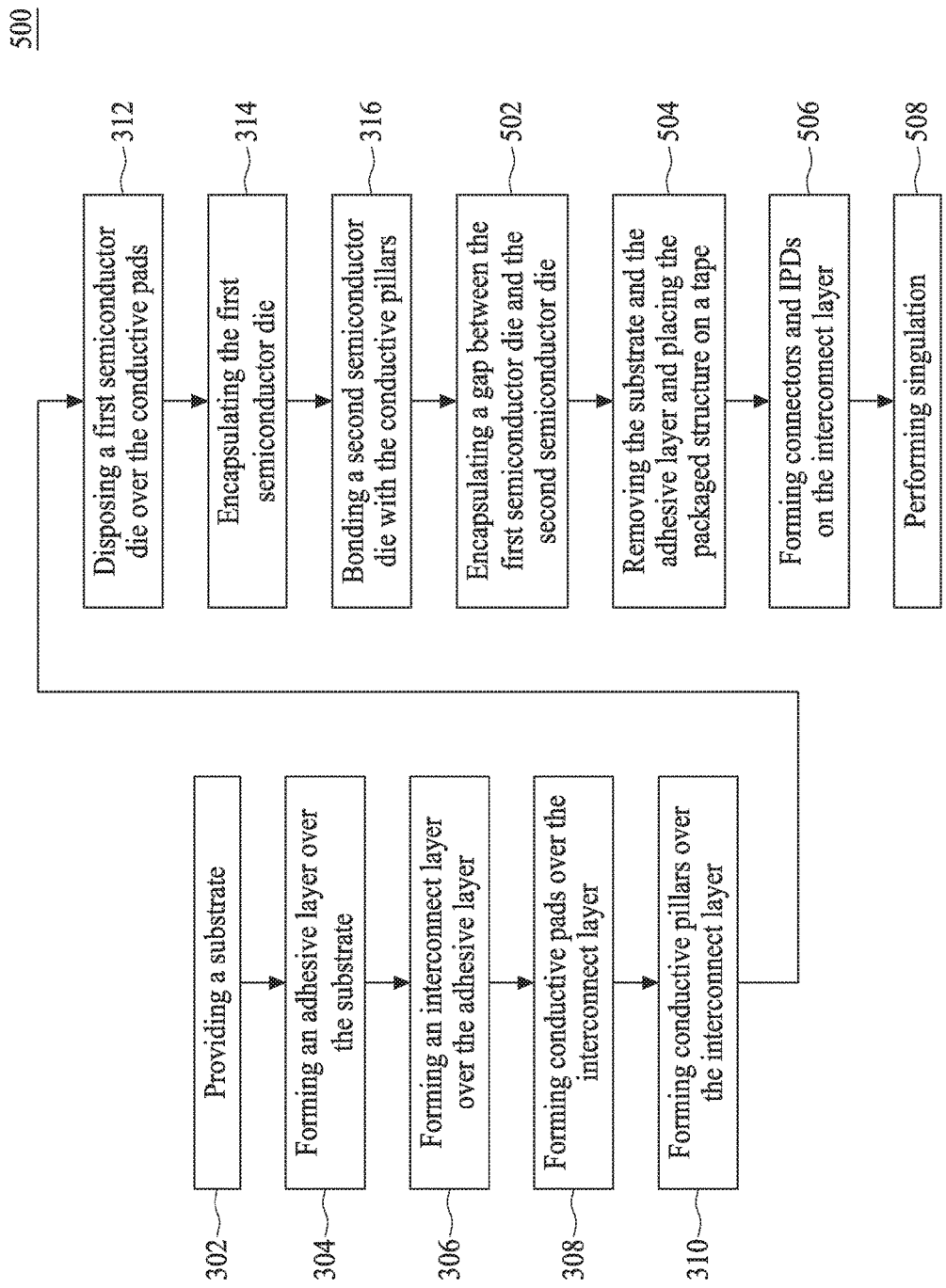
FIG. 5 is a flow diagram of manufacturing a semiconductor packaged structure in FIGS. 2A through 2M and FIGS. 4A through 4E, in accordance with some embodiments.

Referring to FIG. 4A, an encapsulating material 402 fills a gap between the first semiconductor dies 132 and the corresponding second semiconductor dies 140. The respective operation is shown as operation 502 of the process flow 500 in FIG. 5. The encapsulating material 402 may be a molding compound resin such as polyimide, PPS, PEEK, PES, a heat resistant crystal resin, or combinations thereof. In some embodiments, the encapsulating material 402 may be same as the encapsulating material 136 or 148. The difference between the operations 318 and 502 may lie in that, in the process flow 500 for the present embodiment, the encapsulating material 402 would be applied to the gap between the first semiconductor dies 132 and the second semiconductor dies 140. In some embodiments, the encapsulating material 402 fills a gap between the second semiconductor dies 140 and the encapsulating material 136. In some embodiments, the encapsulating material 402 surrounds the conductive pads 142 and the connectors 144. The other surfaces of the second semiconductor dies 140, such as the top surfaces or lateral surfaces, would not be covered by the encapsulating material 402.

Figure 4B:
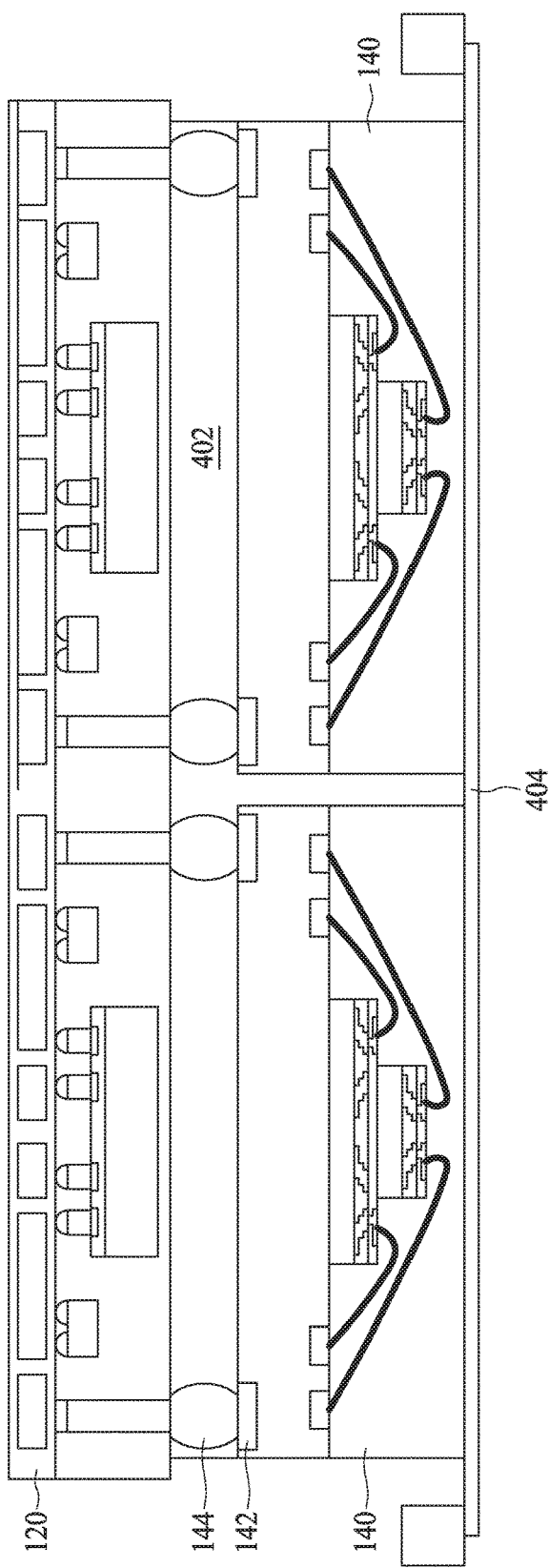

In FIG. 4B, the substrate 102 and the adhesive layer 104 are removed. The respective operation for FIG. 4B is shown as operation 504 of the process flow 500 in FIG. 5, similar to operation 320 in FIG. 3. In comparison with operation 320, the difference of operation 504 may be due to the fact that a tape is introduced for carrying the semiconductor packaged structure 100. In accordance with some embodiments, a frame made of rigid materials may also be utilized to hold the tape and support the semiconductor packaged structure 100. In the present embodiment, the rigidity of the uncompleted packaged structure 100 may be insufficient against external stress. The frame along with the tape can help increase the rigidity of the semiconductor packaged structure 100 during the subsequent processes.

Figure 4C:
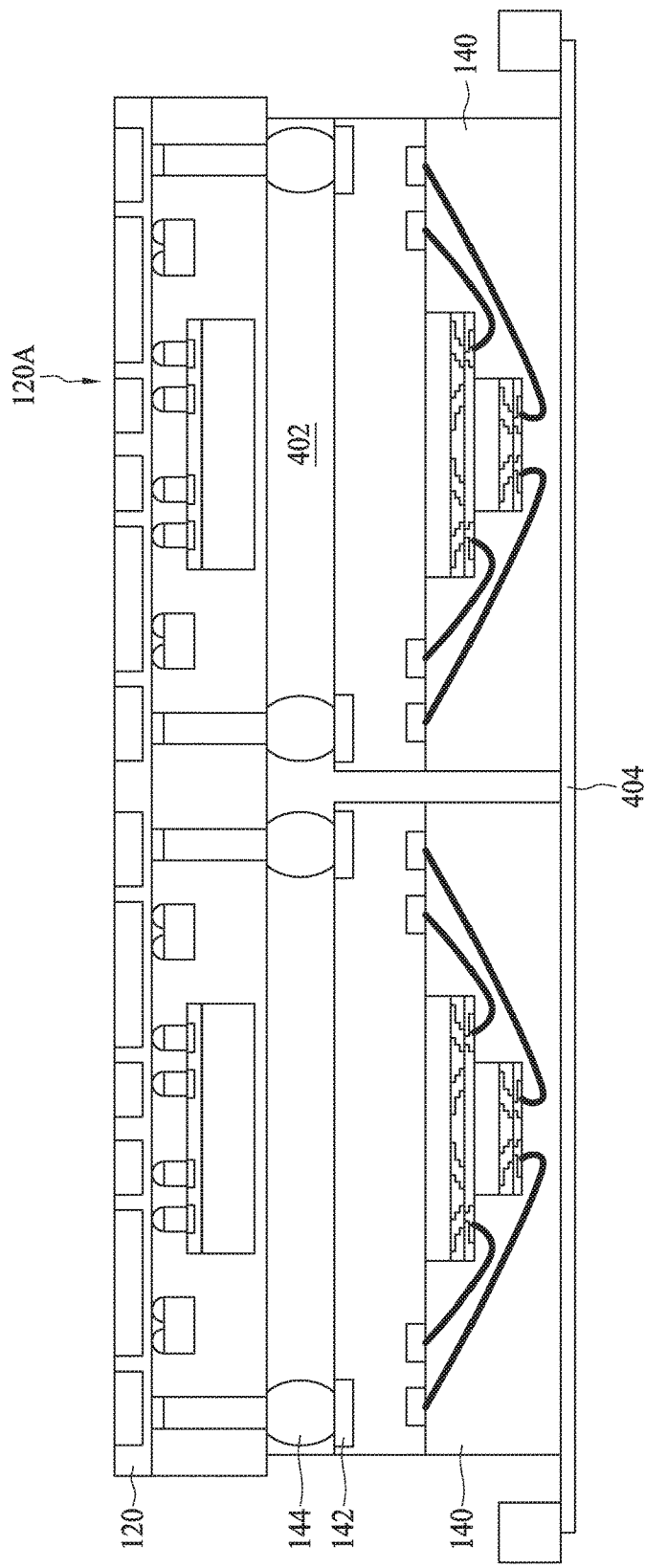
Figure 4D:
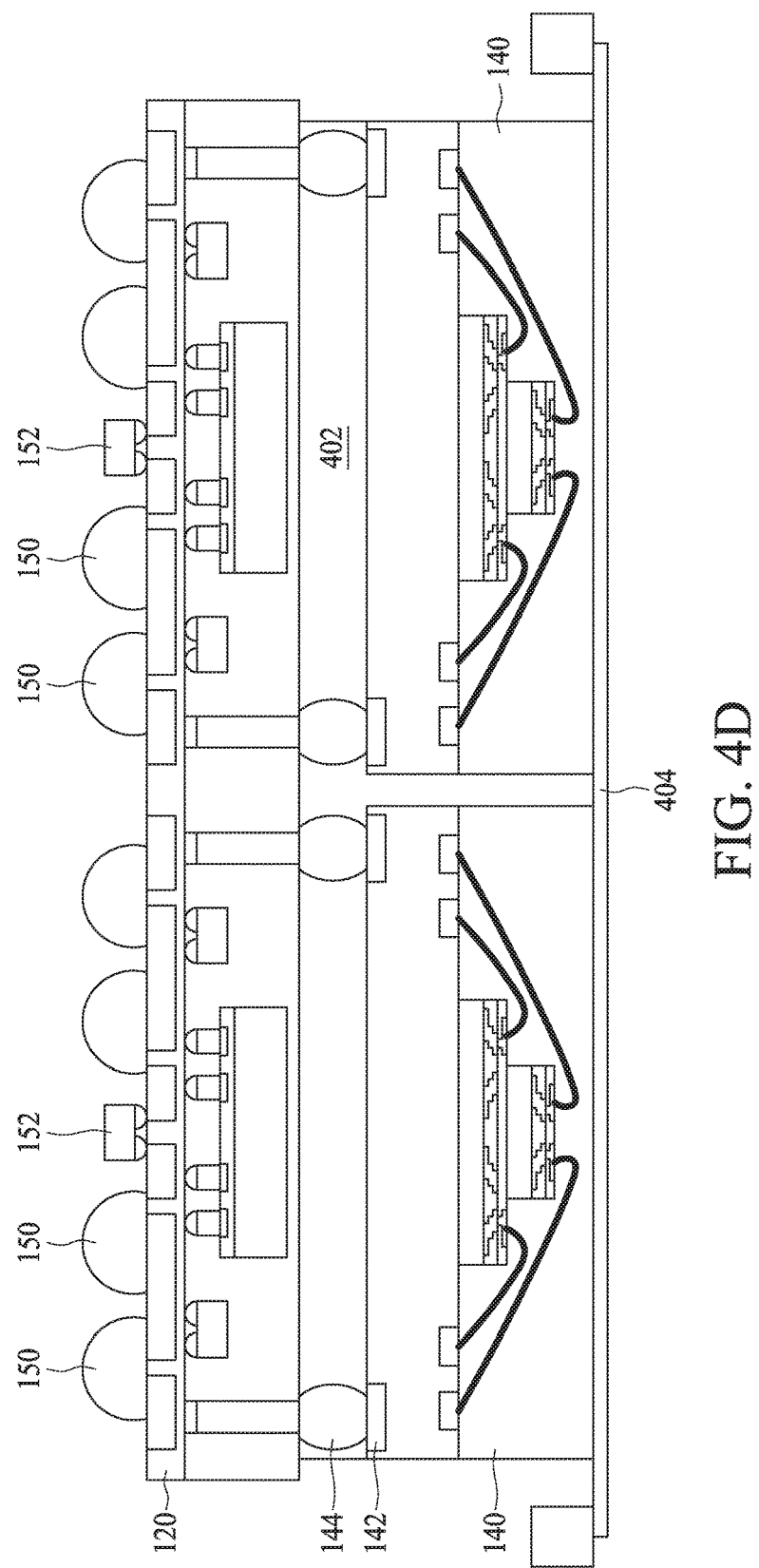
Figure 4E:
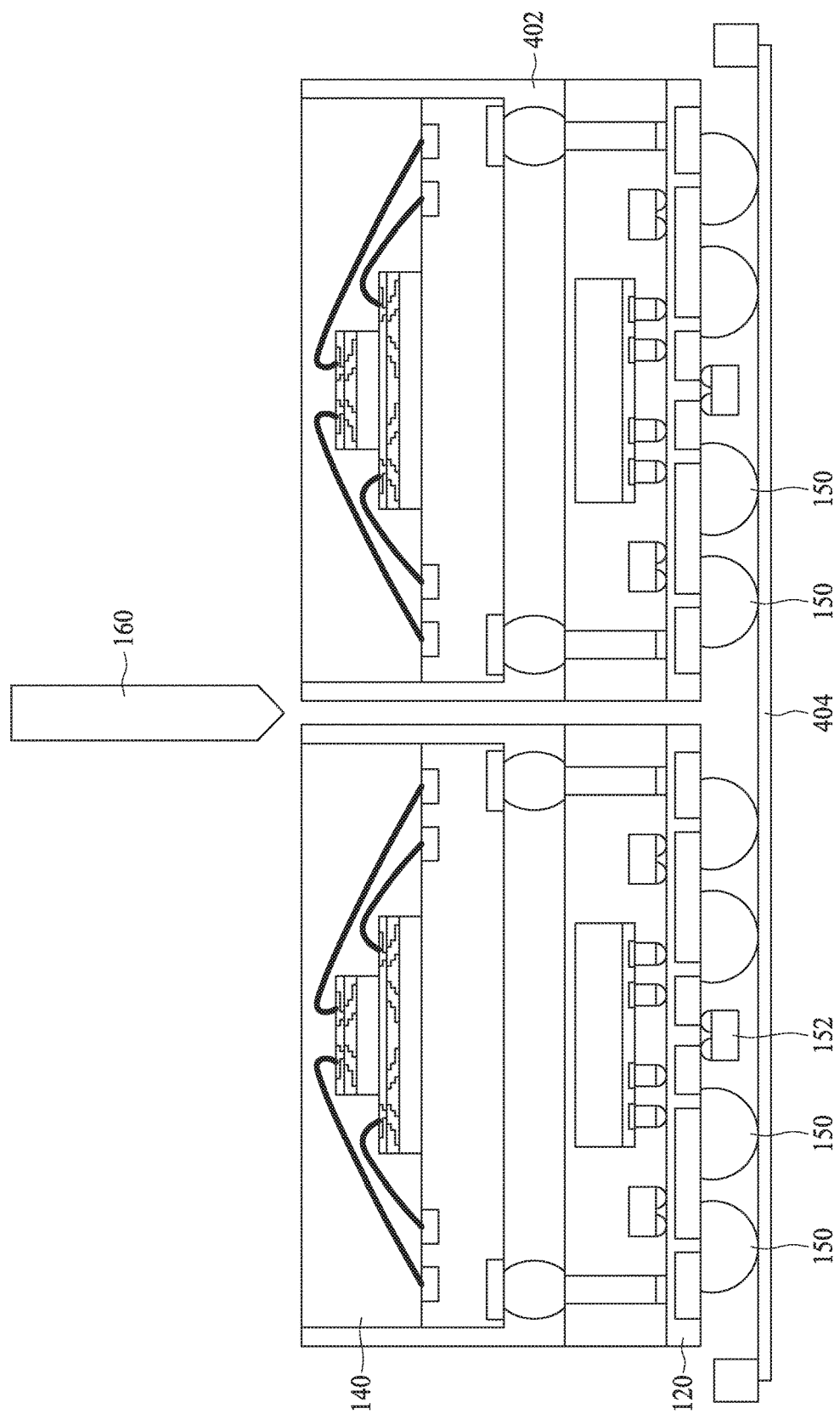

The operations in FIGS. 4C, 4D and 4E are similar to those in FIGS. 2P, 2Q and 2R, respectively. The respective operations are shown as operations 506 and 508 of the process flow 500 in FIG. 5. The major difference of FIGS. 4C through 4E, as compared to FIGS. 2P through 2Q, lies in the introduction of the tape and optionally the frame for supporting the semiconductor packaged structure 100.

FIGS. 2A through 2L followed by FIGS. 6A through 6F are cross-sectional views of intermediate structures for yet another method of manufacturing a semiconductor packaged structure, in accordance with some embodiments. In the subsequent discussion, the operations shown in FIGS. 2A through 2L (corresponding to operations 302 through 314) are omitted for simplicity, while FIGS. 6A through 6F are discussed with reference to corresponding operations in FIG. 7. In addition, the terms "substrate" and "adhesive layer" used in operations 302, 304 or 306 of FIG. 7 are replaced with the term "first substrate" and "first adhesive layer", respectively, in order to distinguish over a second substrate and a second adhesive layer in other operations, as would be introduced later.

Figure 6A:
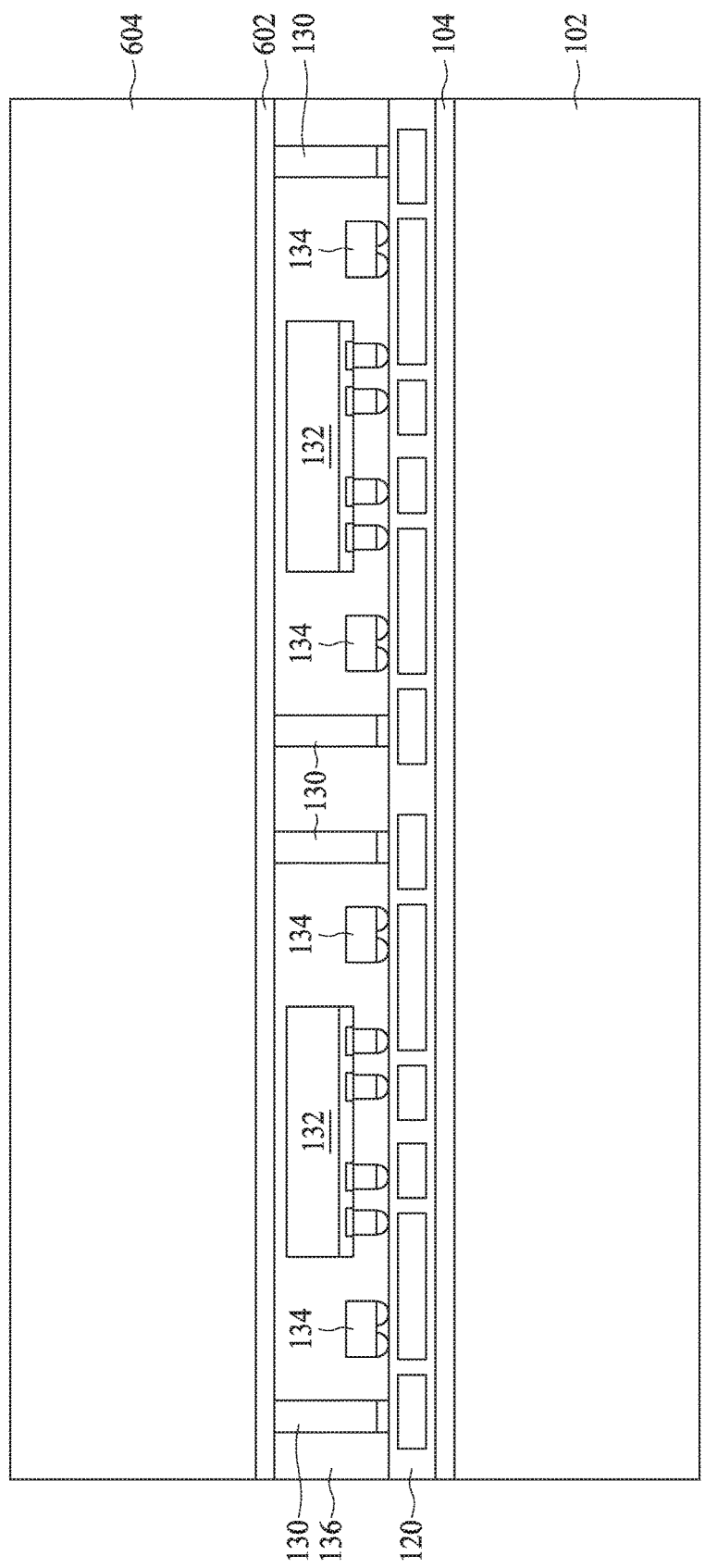
FIGS. 6A through 6F are cross-sectional views of some intermediate structures for a method of manufacturing a semiconductor packaged structure, in accordance with various embodiments.
Figure 7:
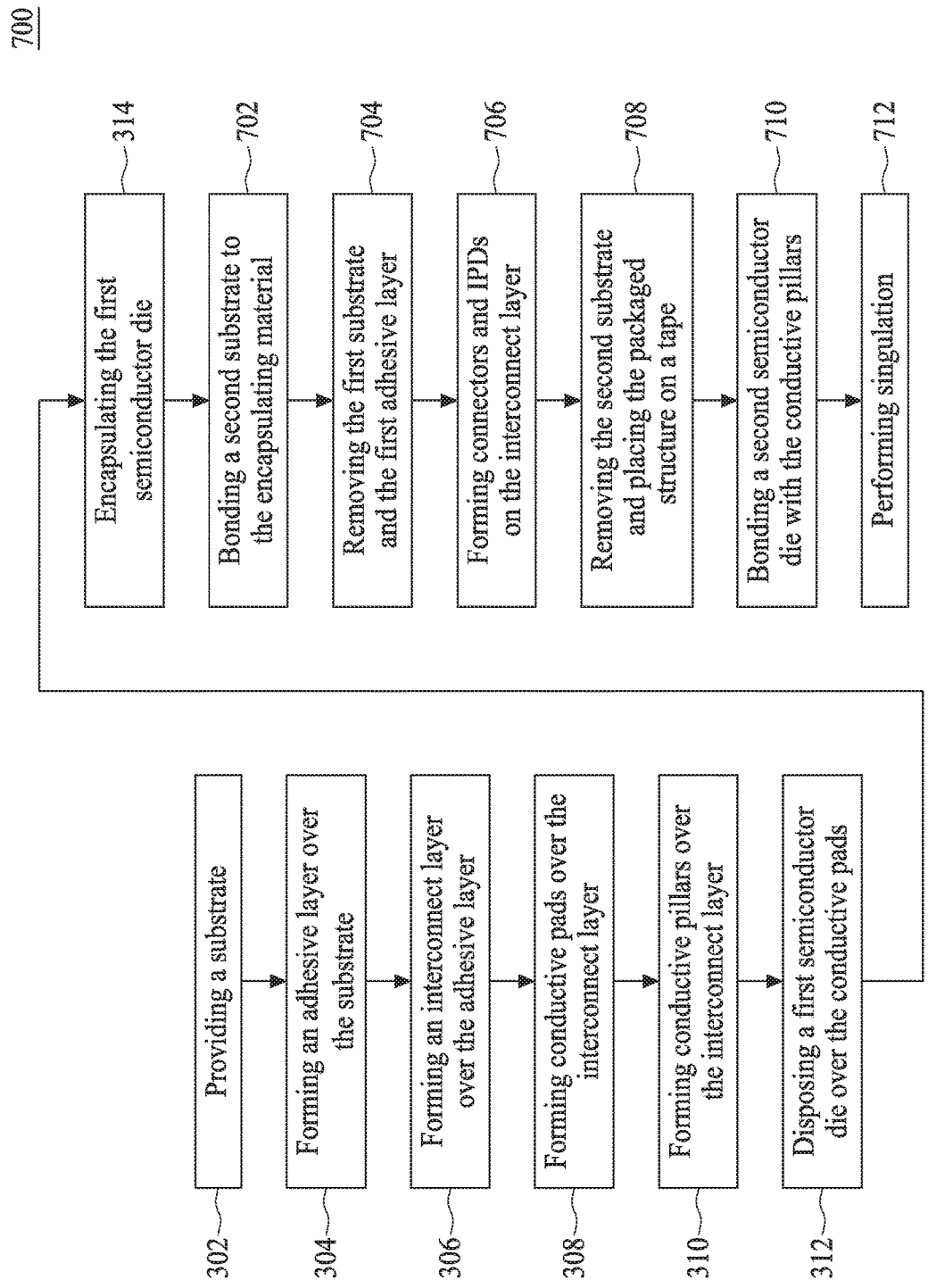
FIG. 7 is a flow diagram of manufacturing a semiconductor packaged structure in FIGS. 2A through 2L and FIGS. 6A through 6F, in accordance with some embodiments.

Referring to FIG. 6A, a second adhesive layer 602 is formed over the first semiconductor dies 132 and the encapsulating material 136. Next, a second substrate 604 is disposed over the second adhesive layer 602. The second substrate 604 is bonded to the encapsulating material 136 through the second adhesive layer 602. The respective operation for FIG. 6A is shown as operation 702 of the process flow 700 in FIG. 7. In accordance with some embodiments, the second adhesive layer 602 may comprise a material similar to the (first) adhesive layer 104 in FIG. 2A. In accordance with some embodiments, the second substrate 604 may comprise a material similar to the (first) substrate 102 in FIG. 2A.

Figure 6B:
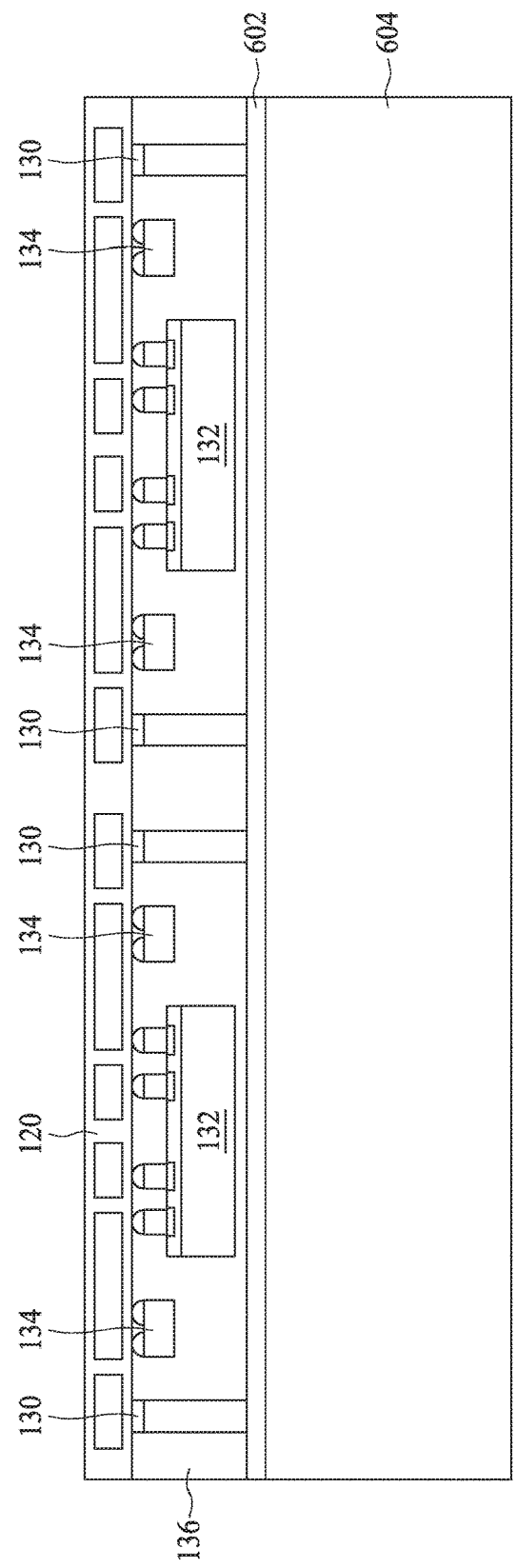

Once the second substrate 604 is bonded to the encapsulating material 136, the first substrate 102 and the first adhesive layer 104 are released from the semiconductor packaged structure 100. The respective operation for FIG. 6B is shown as operation 704 of the process flow 700 in FIG. 7.

Figure 6C:
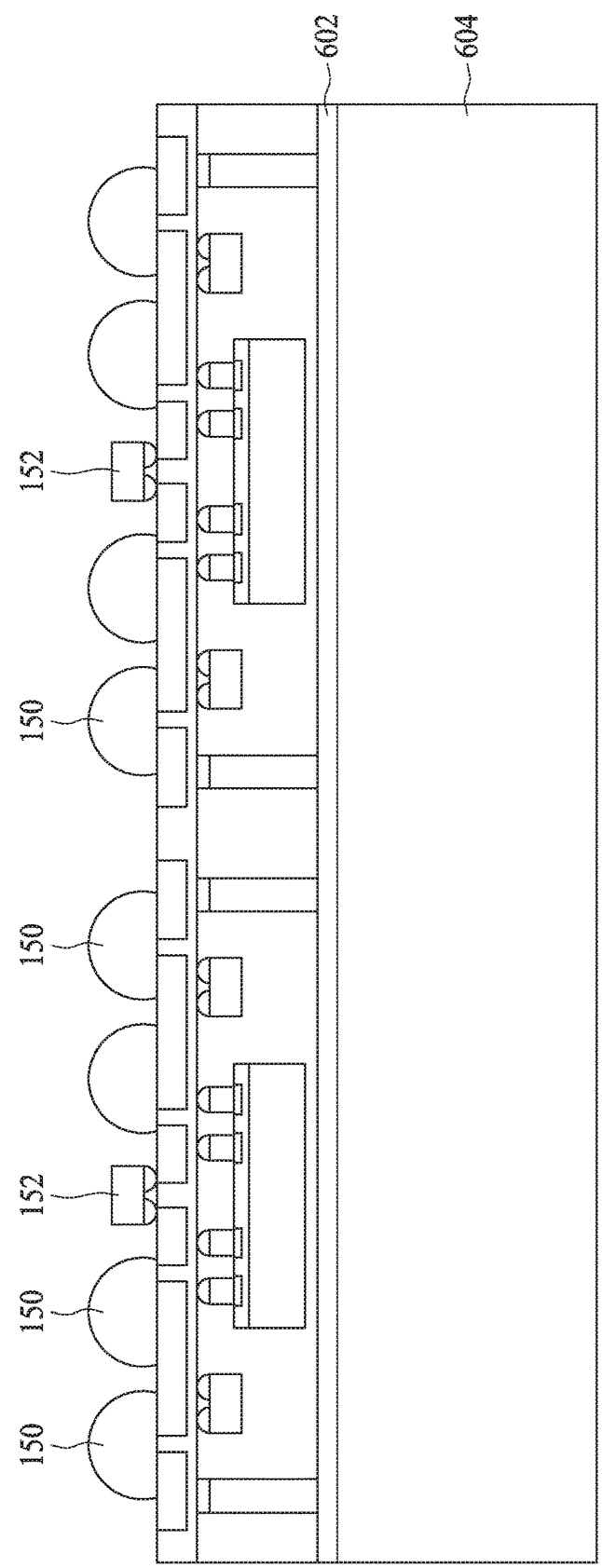

In FIG. 6C, the connectors 150 and IPDs 152 are formed over the interconnect layer 120. The respective operation for FIG. 6C is shown as operation 706 of the process flow 700 in FIG. 7. The materials and processes for the formation of the connectors 150 and IPDs 152 are similar to those described and illustrated with reference to FIGS. 2P and 2Q or alternatively FIGS. 4C and 4D.

Figure 6D:
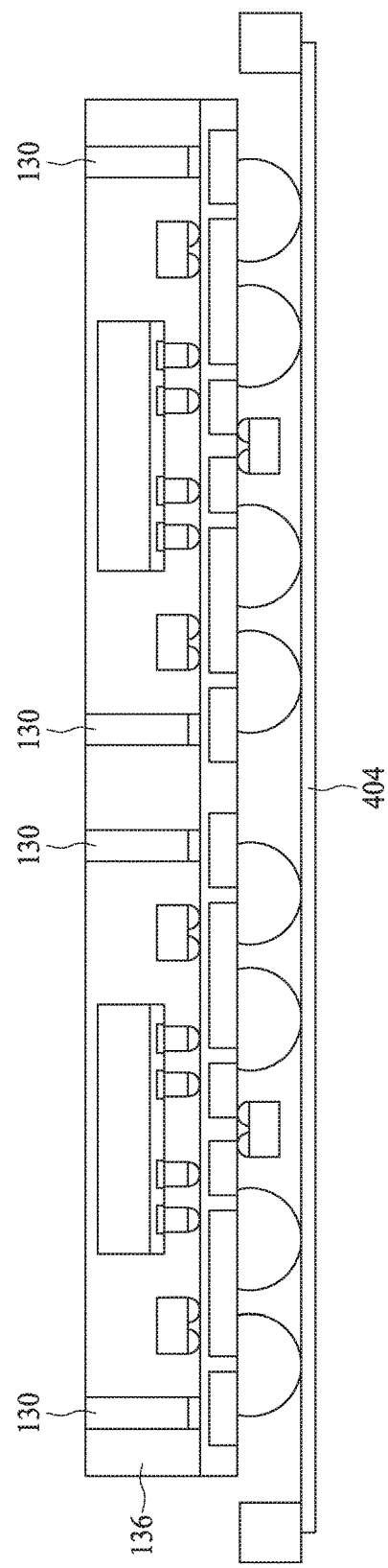

Subsequently, the second substrate 604 and the second adhesive layer 602 are removed in FIG. 6D. The respective operation for FIG. 6D is shown as operation 708 of the process flow 700 in FIG. 7. Furthermore, the semiconductor packaged structure 100 is placed on a tape 404. In accordance with some embodiments, the encapsulating material 136 is thinned down such that the conductive pillars 130 are exposed.

Figure 6E:
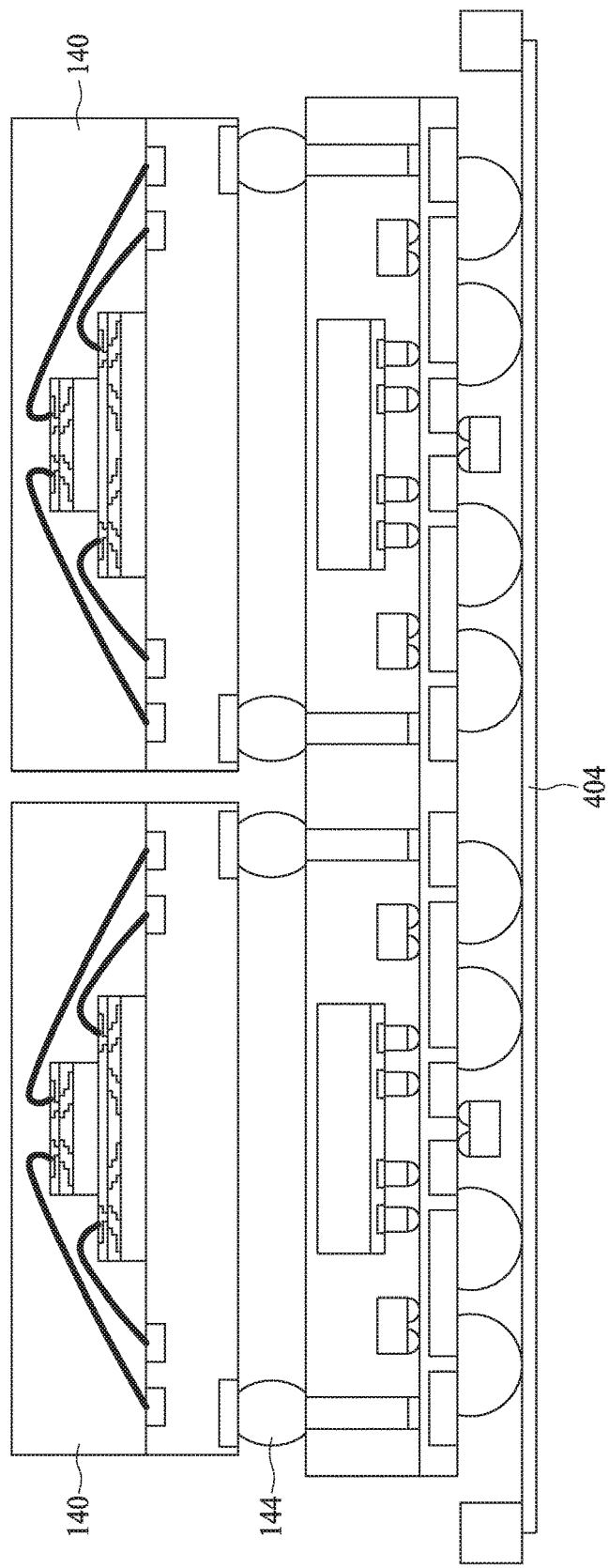

Referring to FIG. 6E, the second semiconductor dies 140 are provided and bonded to the conductive pillars 130. The respective operation for FIG. 6E is shown as operation 710 of the process flow 700 in FIG. 7. In some embodiments, the second semiconductor dies 140 are in contact with the conductive pillars 130 through only the connectors 144. In some embodiments, no encapsulating material is utilized for surrounding the connectors 144.

Figure 6F:
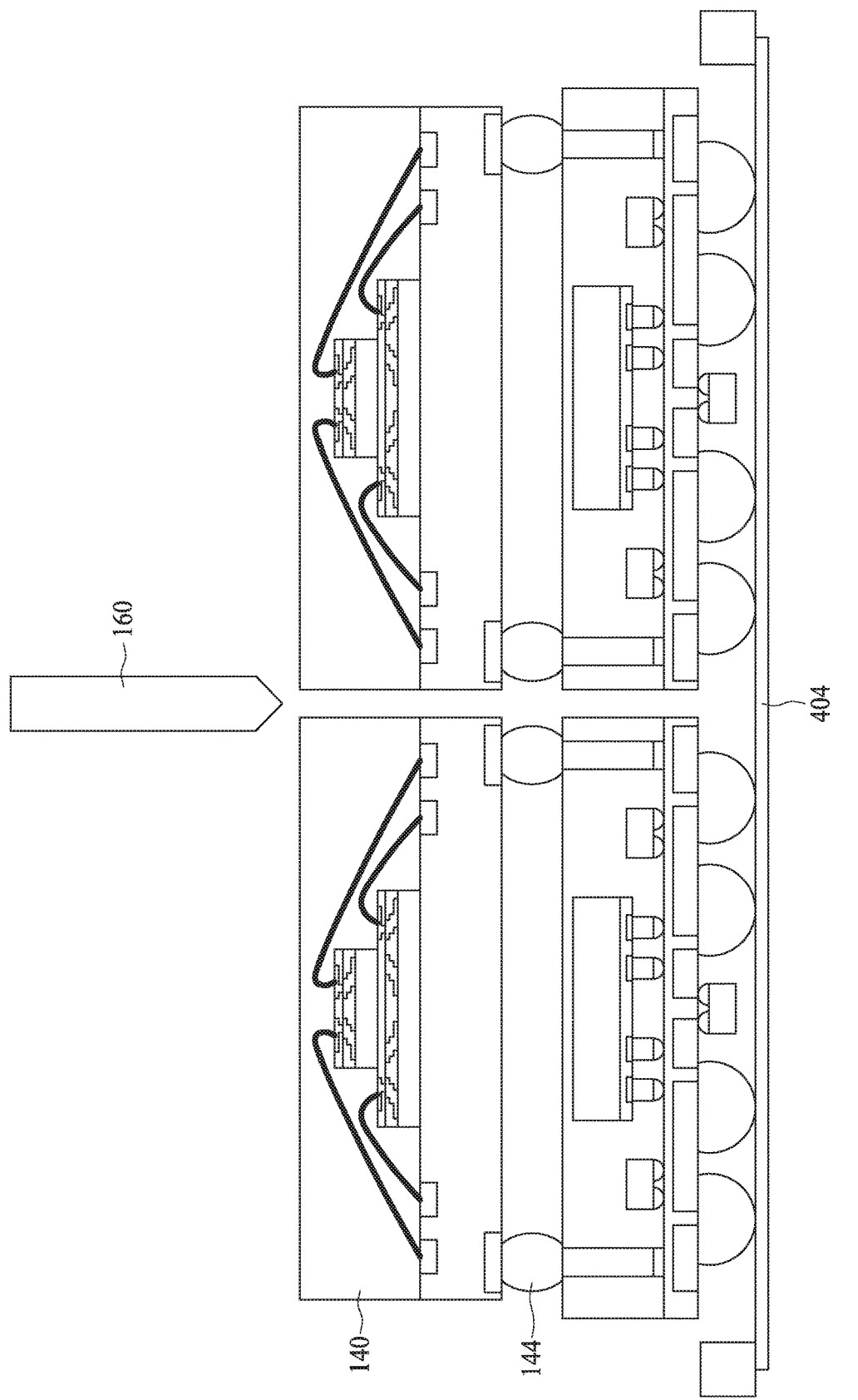

Referring to FIG. 6F, a dicing or singulation operation is performed. The respective operation for FIG. 6F is shown as operation 712 of the process flow 700 in FIG. 7. The materials and processes for the formation of the connectors 150 and IPDs 152 are similar to those described and illustrated with reference to FIG. 2R.

The proposed structures and methods, in which the interconnect layer is formed initially and followed by the bonding process of component dies, include several advantages. The manufacturer may perform more rounds of integrity tests in intermediate stages of manufacturing the packaged structure. Accordingly, connection failures. e.g., short circuit or open circuit, may be detected prior to the attachment of the component dies. The incurred costs in bonding the good dies with the failed interconnect layer can be saved.

In addition, the proposal can accommodate dies with different thickness or heights on a same side of the interconnect layer. Moreover, the manufacturing processes for the component dies and the interconnect layer can be performed concurrently and combined once they are completed. The manufacturing cycle can be reduced further.

The component dies may experience less thermal budget than existing approaches in accordance with some embodiments. The problem of die shift commonly found in the existing encapsulation operation can be effectively alleviated. Furthermore, in integration of IPDs into the package structure, a larger flexibility is reached in selecting the bonding location, thus enhancing the electrical performance and reducing the footprint. Also, the component dies can be stacked and bonded over a carrier substrate with a better flatness, such as a glass-based carrier. The production yield is increased accordingly.

The present disclosure provides a method of manufacturing a structure. The method includes: providing a substrate; forming an adhesive layer over the substrate; forming an interconnect layer comprising a metal line and a metal via over the adhesive layer; forming a plurality of conductive pads over the interconnect layer; forming conductive pillars over the interconnect layer; disposing a first semiconductor die over the conductive pads, the first semiconductor die being spaced apart from the conductive pillars; bonding a second semiconductor die with the conductive pillars; and removing the substrate and the adhesive layer to expose a conductive portion of the interconnect layer.

The present disclosure provides a method of manufacturing a structure. The method includes: providing a first substrate; forming an interconnect layer over the first substrate; forming a plurality of conductive pads over the interconnect layer; bonding a first semiconductor die with the plurality of conductive pads; disposing a second substrate over the first semiconductor die on a side opposite to the first substrate; removing the first substrate from a first surface of the interconnect layer; thinning the interconnect layer to expose a conductive portion of the interconnect layer; and forming a connector on the first surface.

The present disclosure provides a method of manufacturing a structure. The method includes: providing a first substrate; forming an interconnect layer comprising a metal line and a metal via over the first substrate; forming a plurality of conductive pads and a plurality of conductive pillars over the interconnect layer, the plurality of conductive pads comprising a test pad; performing a first test against the interconnect layer through the test pad; bonding a first semiconductor die with the plurality of conductive pads in response to the interconnect layer as passing the first test; encapsulating the first semiconductor die, the plurality of conductive pads and the plurality of conductive pillars with an encapsulating material; and bonding a second semiconductor die with the encapsulated first semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor package, the method comprising:
    providing a substrate;
    forming an adhesive layer over the substrate;
    forming an interconnect layer comprising a metal line and a metal via over the adhesive layer;
    forming a plurality of conductive pads over the interconnect layer;
    forming conductive pillars over the interconnect layer;
    disposing a first semiconductor die over the conductive pads, the first semiconductor die being spaced apart from the conductive pillars;
    bonding a second semiconductor die with the conductive pillars; and
    removing the substrate and the adhesive layer to expose a conductive portion of the interconnect layer.

2. The method of claim 1, further comprising forming a connector electrically connecting the interconnect layer at the conductive portion.

3. The method of claim 1, further comprising:
    encapsulating the first semiconductor die, the conductive pillars and the conductive pads; and
    exposing a top surface of the first semiconductor die.

4. The method of claim 1, further comprising filling a gap between the first semiconductor die and the second semiconductor die.

5. The method of claim 4, further comprising encapsulating the second semiconductor die laterally.

6. The method of claim 1, further comprising bonding an integrated passive device to the interconnect layer on a same side of the first semiconductor die.

7. The method of claim 1, further comprising bonding an integrated passive device and a connector to the interconnect layer on a same side opposite to the first semiconductor die.

8. The method of claim 1, wherein the conductive pads comprises a test pad adjacent to the first semiconductor die.

9. The method of claim 8, further comprising performing a first test against the interconnect layer through the test pad before disposing the first semiconductor die over the conductive pads.

10. The method of claim 8, further comprising performing a second test against the interconnect layer and the first semiconductor die through the test pad before bonding the second semiconductor die with the conductive pillars.

11. A method of manufacturing a semiconductor package, the method comprising:
  providing a first substrate;
  forming an interconnect layer over the first substrate;
  forming a plurality of conductive pads over the interconnect layer;
  bonding a first semiconductor die with the plurality of conductive pads;
  disposing a second substrate over the first semiconductor die on a side opposite to the first substrate;
  removing the first substrate from a first surface of the interconnect layer;
  thinning the interconnect layer to expose a conductive portion of the interconnect layer; and
  forming a connector on the first surface.

12. The method of claim 1, further comprising forming conductive pillars on the interconnect layer before disposing the second substrate over the first semiconductor die.

13. The method of claim 12, further comprising:
  removing the second substrate;
  exposing the conductive pillars; and
  bonding a second semiconductor die with the conductive pillars.

14. The method of claim 13, further comprising performing a singulation operation after bonding the second semiconductor die with the conductive pillars.

15. The method of claim 11, wherein at least one of the first substrate and the second substrate is selected from glass, ceramic or silicon.

16. The method of claim 11, further comprising performing a first test against the interconnect layer through a test pad over the interconnect layer.

17. The method of claim 11, further comprising bonding an integrated passive device to the interconnect layer on a side opposite to the first semiconductor die.

18. A method of manufacturing a semiconductor package, the method comprising:
  providing a first substrate;
  forming an interconnect layer comprising a metal line and a metal via over the first substrate;
  forming a plurality of conductive pads and a plurality of conductive pillars over the interconnect layer, the plurality of conductive pads comprising a test pad;
  performing a first test against the interconnect layer through the test pad;
  bonding a first semiconductor die with the plurality of conductive pads in response to the interconnect layer as passing the first test;
  encapsulating the first semiconductor die, the plurality of conductive pads and the plurality of conductive pillars with an encapsulating material; and
  bonding a second semiconductor die with the encapsulated first semiconductor die.

19. The method of claim 18, wherein the encapsulation of the first semiconductor die and the plurality of conductive pads is performed in response to a result of a second test against the semiconductor die and the plurality of conductive pads as being successful.

20. The method of claim 18, wherein the second semiconductor die is electrically coupled to the interconnect layer through the plurality of conductive pillars.

* * * * *